United States Patent [19]

Kuroda et al.

[11] Patent Number: 5,432,800

[45] Date of Patent: Jul. 11, 1995

[54] METHODS AND APPARATUSES FOR TRANSMISSION AND RECEPTION OF INFORMATION SIGNALS

[75] Inventors: Toru Kuroda; Masafumi Saito; Shigeki Moriyama; Tomohiro Saito; Masayuki Takada; Osamu Yamada, all of Tokyo, Japan

[73] Assignee: Hitachi, Ltd., Tokyo, Japan

[21] Appl. No.: 968,406

[22] Filed: Oct. 29, 1992

[30] Foreign Application Priority Data

Oct. 29, 1991 [JP] Japan ................................ 3-282899
Nov. 18, 1991 [JP] Japan ................................ 3-301780

[51] Int. Cl.⁶ .............................................. G06F 11/10
[52] U.S. Cl. .................................. 371/37.7; 371/37.4
[58] Field of Search .................... 371/37.4, 37.7, 37.1, 371/38.1, 39.1, 40.1, 37.6

[56] References Cited

U.S. PATENT DOCUMENTS

| | | | |
|---|---|---|---|
| 4,630,271 | 12/1986 | Yamada | 371/42 |
| 4,653,051 | 3/1987 | Sugimura et al. | 371/37.4 |
| 4,719,628 | 1/1988 | Ozaki et al. | 371/37.7 |
| 4,760,576 | 7/1988 | Sako | 371/37.4 |
| 4,785,451 | 11/1988 | Sako et al. | 371/37.4 |
| 4,819,236 | 4/1989 | Sako et al. | 371/37.7 |
| 5,068,855 | 11/1991 | Kashida et al. | 371/37.4 |

FOREIGN PATENT DOCUMENTS 0043432 1/1982 European Pat. Off.
0326747 8/1989 European Pat. Off.
8201094 4/1982 WIPO.

OTHER PUBLICATIONS

*CCIR Recommendation 643*, "System for Automatic Tuning and Other Applications in FM Radio Receivers for use with the Pilot-Tone System", Question 46/10, Study Programme 46H/10.

*IEE Proceedings-I*, "Error Control Techniques Applicable to HF Channels" by Bate, et al., vol. 136, No. 1, 1989.

*Electronics and Communication Engineering Journal*, "Coding as a Cure for Communication Calamities: The Successes and Failures of Error Control", P. G. Farrel, vol. 2, No. 6, Dec. 1990, London, G.B.

*Primary Examiner*—Roy N. Envall, Jr.
*Assistant Examiner*—Thomas E. Brown
*Attorney, Agent, or Firm*—Antonelli, Terry, Stout & Kraus

[57] ABSTRACT

Method and apparatus for transmitting an information signal generate a plurality of block signals on the basis of the information signal, generate a plurality of parity block signals on the basis of the plural data block signals, generate a frame signal containing the plural data block signals and the parity block signals, and send out the frame signal. Each of the data block signals includes a first block synchronizing signal indicating the start of the data block signal, a data signal containing the information signal and a first parity signal derived by encoding the data signal. Each of the parity block signals incudes a second block synchronizing signal indicating the start of the parity block signal, a second parity signal and a third parity signal. Bit signals located at same bit positions in the respective second parity signals are derived by encoding bit signals located at the same positions in the respective data signals. Bit signals located at same bit positions in the respective third parity signals are derived by encoding the bit signals located at the same bit positions in the respective first parity signals or alternatively the third parity signal in each parity block signal is derived by encoding the second parity signal in each parity block signal.

46 Claims, 12 Drawing Sheets

METHODS AND APPARATUSES FOR TRANSMISSION AND RECEPTION OF INFORMATION SIGNALS

BACKGROUND OF THE INVENTION

The present invention relates generally to an information signal transmitting method and an apparatus for carrying out the same as well as an information signal receiving method and an apparatus therefor. More particularly, the invention is concerned with methods and apparatus for transmission and reception of information signals which can profitably be used in information transmitting/receiving systems in which information signals are transmitted or received via a transmission path or channel which is rather poor in respect to the transmission quality and in which a high bit rate is difficult to realize, as exemplified by a frequency-modulated (FM) multiplex broadcast for mobile objects or mobile receiver stations.

In recent years, the frequency-modulated multiplex broadcast has widely been put to practical use with the aim of providing new services such as a sound broadcast separate from a stereophonic sound broadcast, a character information presentation and other services by making use of idle of empty spectral regions for multiplexing of digital signals in an FM stereophonic broadcast.

One example of a frequency-modulated multiplex broadcast for the mobile objects or receiver stations, is the RDS system recommended in "CCIR RECOMMENDATION 643". In this system, a (26, 16) code which is rather poor in error correcting capability as the error correction code is employed. Under the circumstances, information signal reception is performed by resorting to a request repeat system for data exchange instead of error correcting reception scheme in the present state of the art.

An example of a fixed receiver station system, is FM multiplex broadcast in Japan, in which a frame structure of 272×34 bits is employed together with a (272, 190) code for error correction, as is illustrated in FIG. 12 of the accompanying drawings. More specifically, referring to FIG. 12, this frame is composed of a frame code (FC) of 18 bits, a mode control code (MC) of 16 bits, and a data field composed of 34 packets each of which includes a data block of 190 bits and a parity block of 82 bits so that data of 272×34 bits in total can be transmitted with one frame. In this frame structure, the (272, 190) code is used as the intra-frame error correcting code.

In the FM multiplex broadcast using the frame of the structure described above, the information signals are sent out in a sequence traversing the frame obliquely, as is indicated by arrows 101 in FIG. 12. Consequently, the receiver is required to be equipped with a frame memory, wherein decoding of the error correcting code is performed after having received one frame wholly.

Further, a data transmission using the (272, 190) code is adopted in the character information broadcast service in Japan, as is disclosed, for example, in U.S. Pat. No. 4,630,271 corresponding to Japanese Patent Applications Nos. 6579/1983 and 54002/1983.

Of the hitherto known systems mentioned above, the system in which the (26, 16) code is employed is poor in the error correction capability is not suited for the transmission of data such as those of idiographic characters typified by Japanese or Chinese language, traffic information or the like which is very susceptible to the influence of the error.

On the other hand, with the frame structure of 272×34 bits with the (272, 190) error correcting code adopted in the fixed receiver station system, the number of times the frame synchronizing signal is sent out is small, involving possibly dislocation in the frame synchronism in the transmission path which suffers not a few errors. Although the oblique sending-out sequence is advantageous in that errors are dispersed, there arises such a disadvantage that excessively large amounts of time is taken for making available the received data by decoding in the case of the mobile receiver station system whose bit rate is low when compared with the fixed receiver station system. Thus, the frame structure is not suited for transmission and reception of such information which must be made available as soon as possible after turn-on of a power supply. As the information of this type, there may be mentioned, for example, information required for displaying the name or identifier of the broadcasting or transmitter station. Besides, it is noted that the effect of the interleave can not be expected to any satisfactory extent with the number of blocks on the order of 34 or so because of burst error due to the fading phenomenon encountered in the mobile receiver system, to another disadvantage. Additionally, in the case of the FM multiplex broadcast of the fixed receiver station system, data decoding can not be performed before one frame has completely been received by the receiver, giving rise to a problem that a remarkable time delay intervenes between the data reception and the data decoding. Accordingly, when this receiver is employed in the mobile receiver system, the information required immediately such as station identifying information can not be made available instantly upon power-on of the receiver or upon switching of channels, presenting a problem in practical applications because the bit rate in the mobile receiver station system is low as compared with that of the fixed receiver station system, as mentioned previously. Furthermore, it should also be pointed out that in such extremely unfavorable receiving conditions which preclude the complete reception of one frame, the received data cannot be utilized at all, to a further disadvantage.

SUMMARY OF THE INVENTION

It is an object of the present invention to provide an information signal transmitting method and an apparatus therefor as well as an information signal receiving method and an apparatus therefor which can decode an information signal instantaneously even at the time of turning-on of a power supply, channel change-over or the like.

Another object of the present invention is to provide information signal transmitting method and apparatus as well as information signal receiving method and apparatus which can decode a part of information signal contained in one frame through an error correcting processing to a significant extent even when the signal of one frame can not be received completely.

Yet another object of the present invention is to provide information signal transmitting method and apparatus as well as information signal receiving method and apparatus which can decode the information signal through an error correcting processing upon every reception of one frame of signal to such an extent that substantially no error remains after the error correction.

In view of the above and other objects which will become more apparent as description proceeds, there are provided according to an aspect of the present invention an information signal transmitting method and an apparatus for carrying out the same, in which a plurality of data block signals are generated on the basis of the information signal to be transmitted, a plurality of parity block signals are generated on the basis of the plural data block signals, and a frame signal containing the plural data block signals and the parity block signals is generated, for thereby constituting a frame signal to be sent out. Each of the above-mentioned data block signals includes a first block synchronizing signal indicating the start of the associated data block signal, a data signal containing the above-mentioned information signal and a first parity signal obtained by coding the data signal. Each of the parity block signals includes a second block synchronizing signal indicating the start of the associated parity block signal, a second parity signal and a third parity signal. Bit signals located at same bit positions in the second parity signals are obtained by encoding the bit signals located at same bit positions in the data signals, respectively. The bit signals located at same bit positions in the third parity signals are obtained by encoding the bit signals located at same bit positions in the first parity signals, respectively, or alternatively the above-mentioned third parity signal in each of the parity block signals is obtained by encoding the second parity signal in each of the parity block signals.

Each of the above-mentioned data signals may contain a CRC (Cyclic Redundancy Check) code signal obtained by coding the information signal contained in each of the data signals.

The first block synchronizing signal mentioned above may differ from the second block synchronizing signal.

The aforementioned frame signal may further include a frame synchronizing signal indicating the start of the frame signal.

Each of the data signals and each of the second parity signal mentioned above may be composed of 190 bit signals, respectively, while each of the first parity signals and each of the third parity signals may be composed of 82 bit signals, respectively.

The parity block signals may be dispersed substantially uniformly in the frame signal.

Upon sending out the frame signal, a sound signal may be provided, whereon the sound signal and the frame signal may be multiplexed and the multiplexed signal may be frequency-modulated to be sent out as a frequency-modulated or FM multiplexed signal.

In a method and apparatus for receiving an information signal according to another aspect of the invention, a sent signal is received as a received frame signal. The frame signal includes a plurality of data block signals and a plurality of parity block signals. Each of the data block signals includes a first block synchronizing signal indicating the start of the associated data block signal, a data signal containing the information signal mentioned above and a first parity signal derived by coding the data signal. Each of the parity block signals includes a second block synchronizing signal indicating the start of the associated parity block signal, a second parity signal and a third parity signal. Bit signals located at same bit positions in the second parity signals are those derived by encoding the bit signals located at same bit positions in the data signals, respectively. The bit signals located at same bit positions in the third parity signals are those derived by encoding the bit signals located at same bit positions in the first parity signals, respectively, or alternatively the third parity signal in each of the parity block signals is the signal derived by coding the second parity signal in each of the parity block signals. In the information signal receiving method and apparatus, at least one of the first block synchronizing signals and the second block synchronizing signals mentioned above is detected from the received frame signal. In response to the detection of at least one block synchronizing signal mentioned above, the data signals as received and first received parity signals corresponding, respectively, to these data signals and the first parity signals contained in the associated data block signals, respectively, as well as second received parity signals and third received parity signals corresponding, respectively, to the second parity signals and the third parity signals contained in the associated parity block signals, respectively, are stored in a storage unit on the basis of the received frame signal. The received information signal corresponding to the information signal is decoded on the basis of the signals stored in the storage unit, whereon the received signal is identified on the basis of the decoded received information signal.

In the decoding and identifying step mentioned above, a step of decoding the received data signal and the first received parity signal corresponding to each of the data block signals may be carried out through a first error correction processing, whereon a step of decoding the received parity signal and the third received parity signal corresponding to each of the parity block signals may be effectuated through a second error correction processing, being followed by a first decision step of making decision as to whether any error not corrected exists in the received data signal or the first received parity signal which corresponds to each of the data block signals and which has been decoded through the first error correction processing, and a step of identifying as a reception signal the received information signal which corresponds to the above-mentioned information signal and which is contained in each of the received data signals decoded through the aforementioned first error correcting processing and decided as not containing any error uncorrected.

In this case, the information signal can instantaneously be decoded even upon power turn-on, channel change-over or the like operation. Besides, even when the signal of one frame can not completely be received, a part of the information signal included in the one-frame signal can be decoded through the error correcting processing to some extent.

Further, in the decoding and identifying step mentioned above, a step of decoding the bit signals located at same positions in the received data signals decoded through the respective first error correction processings and corresponding to the frame signal as well as the bit signals located at same bit positions in the second received parity signals decoded through the respective second error correction processings and corresponding to the frame signal may be carried out through a third error correcting processing, when decision is made that error remains uncorrected in any one of the received data signals or the first received parity signals which correspond to the data block signals contained in the frame signal and which have been decoded through the first error correcting processing, while a step of decoding the bit signals located at same positions in the first received parity signals decoded through the respective first error correction processings and corresponding to the frame signal as well as the bit signals located at same bit positions in the third received parity signals decoded through the respective second error correcting processings and corresponding to the frame signal may be effectuated through a fourth error correcting processing, when decision is made that error remains uncorrected in any one of the received data signals or the first received parity signals which correspond to the data block signals contained in the frame signal and which have been decoded through the first error correcting processing, being followed by a step of decoding through a fifth error correcting processing the signal of the received data signals decoded through the third error correcting processing and the first received parity signals decoded through the fourth error correcting processing and corresponding to the respective data block signals contained in the frame signal, wherein the signal undergoing the fifth error correcting processing corresponds to the received data and the first received parity signal decoded through the first error correcting processing and decided that uncorrected error exists, a second decision step of making decision as to whether or not error remains uncorrected in the received data signal which has been decoded through the fifth error correcting processing and which corresponds to each of the data block signals, and a step of identifying as the reception signal the signal which corresponds to the information signal and which is contained in each of the data signals decoded through the fifth error correcting processing and decided as containing no uncorrected error.

In this case, when one frame signal can be received, the information signal can be decoded through adequate error correcting processing, whereby decoding can be performed to such extent that substantially no error remains after the correction.

In a preferred mode for carrying out the invention, each of the data signals contains a CRC (Cyclic Redundancy Check) code signal obtained by coding the aforementioned information signal contained in the data signal, wherein the aforementioned first decision step may include a step of making decision as to whether or not any uncorrected error exists in the received data signal or the first received parity signal decoded through the first error correcting processing on the basis of the received CRC code signal contained in the received data signal decoded through the first error correcting processing and corresponding to each of the data block signals, while the second decision step may include a step of making decision as to whether or not uncorrected error exists in the received data signal corresponding to each of the data block signals and decoded through the fifth error correcting processing on the basis of the received CRC code signal corresponding to the CRC code signal contained in the received data signal which corresponds to each data block signal and decoded through the fifth error correcting processing. By virtue of this arrangement, the first and second decisions can be performed with further improved accuracy.

The first block synchronizing signals may differ from the second block synchronizing signals.

The frame signal may further include a frame synchronizing signal indicating the start of the frame signal.

Each of the data signals and each of the second parity signal may be composed of 190 bit signals, respectively, while each of the first parity signals and each of the third parity signals may be composed of 82 bit signals, respectively.

The parity block signals may preferably be dispersed substantially uniformly in the frame signal.

In that case, concentration of error in the received signal before being decoded can not take place owing to the effect of interleave, whereby error after the error correction can further be reduced. Besides, concentrated continuation of transmission/reception of the parity block signals can be avoided, whereby the decoding can instantaneously be performed at any time even upon turn-on of the power supply.

In receiving a sent frame signal as a received frame signal, it is preferred to receive an FM multiplexed signal containing the frame signal, whereupon the received FM multiplexed signal is frequency-demodulated, and then the frame signal is separated from the multiplexed signal.

DESCRIPTION OF THE PREFERRED EMBODIMENTS

In the following, preferred or exemplary embodiments of the information signal transmitting method and apparatus as well as the information signal receiving method and apparatus according to the present invention will be described in detail by reference to the accompanying drawings.

To begin with, a first embodiment of the invention will be described by referring to FIGS. 1 to 3.

Figure 2:
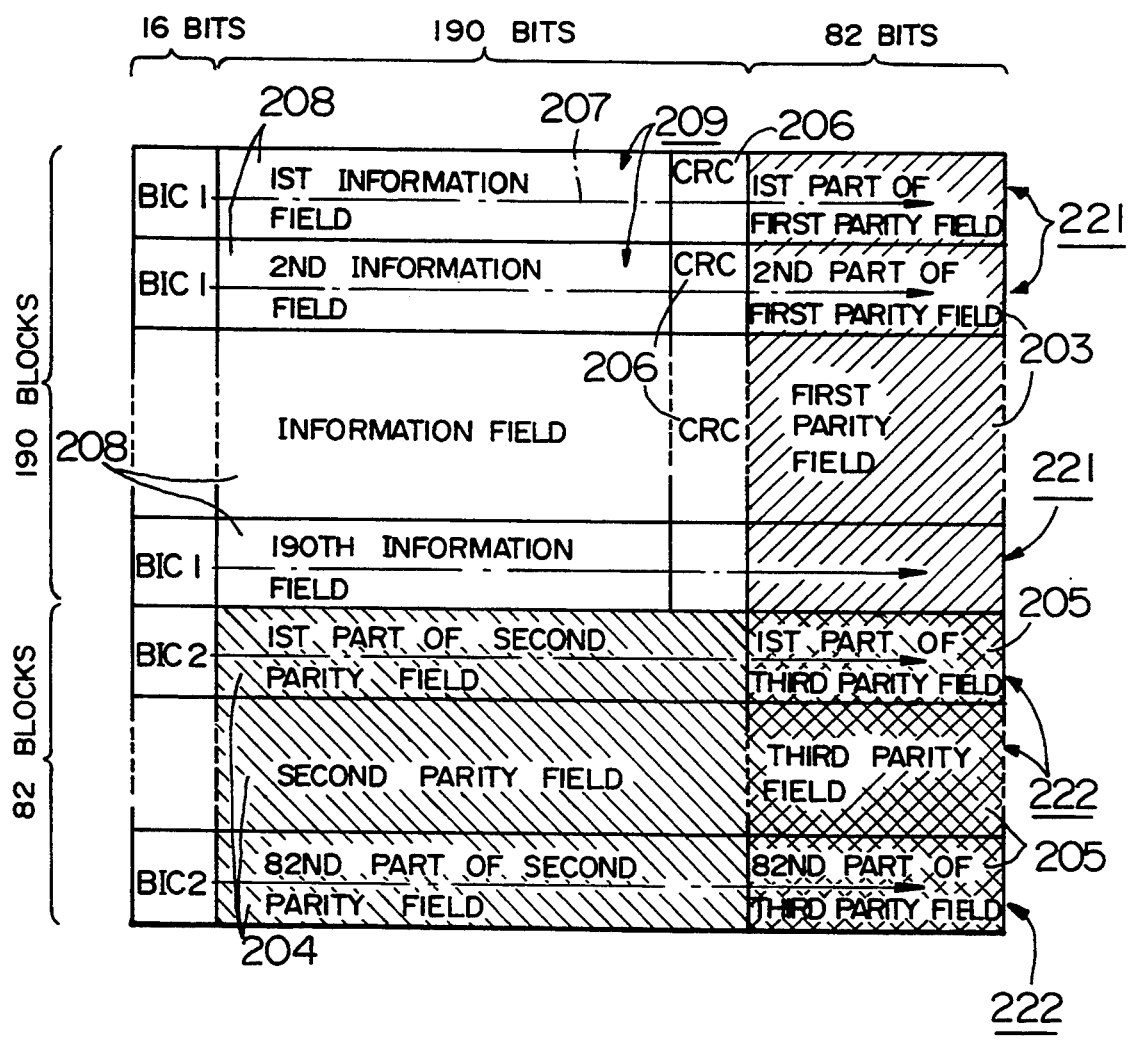
FIG. 2 is a conceptual view for illustrating, by way of example, a frame structure which can be employed in carrying out the invention.

First, referring to FIG. 2, there is shown conceptually or schematically an example of a frame structure which can be employed in carrying out the present invention. As can be seen in the figure, this frame is composed of 190 data blocks denoted generally by a reference numeral 221 and 82 parity blocks denoted by a numeral 222. Each of the data blocks 221 includes a first block synchronizing code field BIC1 of 16 bits indicating a start of the data block, a data field 209 of 190 bits and a first parity field 203 of 82 bits. The data field 209 mentioned above includes an information part 208 corresponding to an information signal representing the information to be transmitted (e.g. data such as those of characters, graphics, traffic information or the like) and a cyclic redundancy check code part (hereinafter referred to as the CRC part in abbreviation) 206 which contains a CRC code resulting from encoding of the information contained in the associated information part 208. The CRC code 206 is provided for the purpose of detecting an overlook or undetected error of the (272, 190) code. It should however be mentioned that the data field need not always contain the CRC code 206. Each of the first parity codes 203 is obtained by coding the data 209 in the associated data field with the (272, 190) code in the horizontal direction (or rowwise direction) as viewed in FIG. 2. Namely, the first parity code 203 is obtained by coding the data of the data field 209. On the other hand, each of the parity blocks 222 is composed of a second block synchronizing field BIC2 of 16 bits indicating the start of the associated parity block 222, a second parity field 204 and a third parity field 205. The parity codes in the second parity field 204 are obtained by coding the data in the data fields 209 containing 190 data blocks 221 by the (272, 190) code for every vertical bit array or in the vertical or columnwise direction, so to say, as viewed in FIG. 2. More specifically, the bits located at same bit positions in the respective second parity fields 204 are those which are derived by encoding or coding the bits located at same bit positions in the respective data field 209. The third parity codes in the field 205 are obtained by coding the first parity codes in the field 203 of the 190 data blocks 221 by the (272, 190) code for every vertical bit array or in the vertical or columnwise direction as viewed in FIG. 2. To say in another way, the bits located at same bit positions in the respective third parity fields 205 are those which are derived by coding the bits located at same bit positions in the first parity fields 203, respectively. At this juncture, it is noted that the third parity codes in the field 205 represent intrinsically both the vertically and horizontally encoded parities as the nature of the product code. More specifically, although the third parity code in the field 205 of each of the parity blocks 82 is obtained by coding the second parity code in the field 204 of each of the parity blocks 82, the third parity codes 205 thus obtained are identical with the third parity codes 205 derived through the encoding in the vertical direction mentioned above. Parenthetically, it should be mentioned that the invention can equally apply to a case where both the parity codes mentioned above are not equal to each other. The sequence in which the frame shown in FIG. 2 is sent out is indicated by horizontal arrows 207 inserted in each block in FIG. 2.

In the case of the instant embodiment of the invention now under consideration, the first block synchronizing code BIC1 and the second block synchronizing code BIC2 have respective bit patterns which differ from each other. In this conjunction, it should however be mentioned that the first block synchronizing code BIC1 and the second block synchronizing code BIC2 may have a same bit pattern in the case where the frame itself has a frame synchronizing code indicating the start of the frame.

When the signals are sent out in the sequence mentioned above by using the virtual frame structure illustrated in FIG. 2, a receiver can decode these signals on a block-by-block basis before all of 272×272 bits within one frame of the signals as sent out have been received. Thus, this system is suited for transmission of data such as the sender station identification data which usually demands instantaneous display. Further, discriminative identification of the transmitted or received block as to whether it is the data block 221 or the parity block 222 can be made by making use the block synchronizing code affixed at the start of each block, whereby possibility of the parity block 222 being erroneous taken for as the data block 221 in the decoding can positively be prevented. It is further noted that in the case where the conditions for transmission are unfavorable, there may arise such situation that the decoding is no more possible through the error correction only in the horizontal or rowwise direction. With the conventional error correction scheme which can afford protection against error only in one direction, reception of succeeding data has to be waited for, in order to realize the complete decoding. In contrast, with the system according to the invention described above, decoding can be performed not only in the vertical (columnwise) direction but also in the horizontal (rowwise) direction upon reception of one frame, because possible errors for 272×272 bits are uniformly dispersed within the frame. Besides, since the error correcting codes can be decoded in duplicate, the error correction efficiency can be enhanced significantly. Of course, the data decoding can be performed without awaiting the succeeding data according to the invention.

Figure 1:
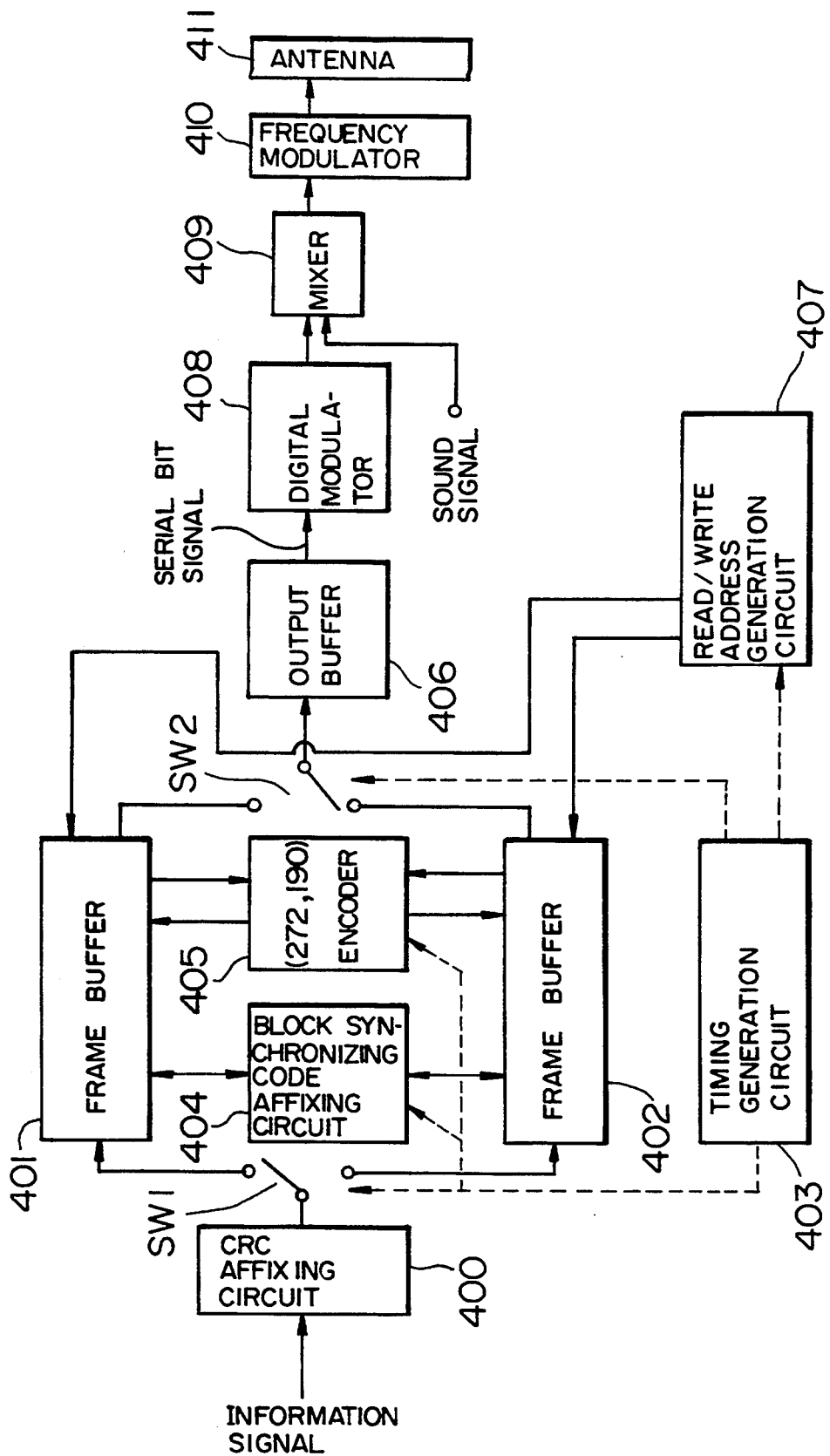
FIG. 1 is a block diagram showing an arrangement of a transmitter apparatus according to an exemplary embodiment of the present invention.

FIG. 1 shows an exemplary embodiment of a transmitter apparatus for carrying out the transmitting method described above by reference to FIG. 2.

In FIG. 1, a reference numeral 400 denotes a CRC code adding circuit which is designed to add or affix the aforementioned CRC code 209 on a data-field basis to the information signal inputted in the form of a serial-bit signal. Output data (data signal) of the CRC adding circuit 400 is stored in a frame buffer 401 or 402 via an input switch SW1.

A timing generation circuit 403 generates a timing signal indicating a timing for reading out one frame at a predetermining bit rate and at the same time serves for changing over the input switch SW1 and an output switch SW2 for loading the data from either one of two frame buffers 401 and 402 into an output buffer 406. The switches SW1 and SW2 are connected to the frame buffers 401 and 402 so as to be changed over oppositely to each other. A reference numeral 405 denotes an encoder for affixing error correcting codes (i.e., the first parity code 203, the second parity codes 204 and the third parity code 205) to the data placed in the frame buffers 401 and 402, respectively. More specifically, after having confirmed that the switches SW1 and SW2 have been changed over by the timing generation circuit 403 in the manner as mentioned above, the error correcting codes are affixed to the data within the frame buffer which is not electrically connected to the input switch SW1 but connected to the output switch SW2. A reference numeral 404 denotes a circuit serving for affixing the block synchronizing code. More particularly, after having confirmed that the error correcting codes have been affixed by the encoder 405 to the data within the frame buffer not connected to the input switch SW1, the block synchronizing code BIC1 or BIC2 is added or affixed to the data placed within the above-mentioned frame buffer. As an overall result of the operation described above, a frame of the structure shown in FIG. 2 is implemented within the frame buffer. The data as prepared in this way are then transferred to the output buffer 404 through the output switch SW2 in the sequence shown in FIG. 2. In further reference to FIG. 1, a reference numeral 407 denotes a read/write address generating circuit which responds to a signal supplied from the timing generation circuit 403 to thereby supply a write address signal or a read address signal to the frame buffers 401 and 402 so that the frames each of the structure shown in FIG. 2 are realized within the frame buffers 401 and 402, respectively.

In the case of the instant embodiment of the invention, the output signal (serial bit signal) of the output buffer 406 undergoes a digital modulation by a digital modulator 408, and the digitally modulated signal is mixed with a sound signal by a mixer 409. The output signal from the mixer 409 undergoes then a frequency modulation (FM) by a frequency modulator 410 to be subsequently sent out as a frequency-modulated or FM multiplexed signal from an antenna 411. At this juncture, it should however be mentioned that the present invention is not necessarily restricted to the transmission in the form of the FM multiplexed signal, but the output signal of the output buffer 406 may be transmitted on-line intact.

Figure 3:
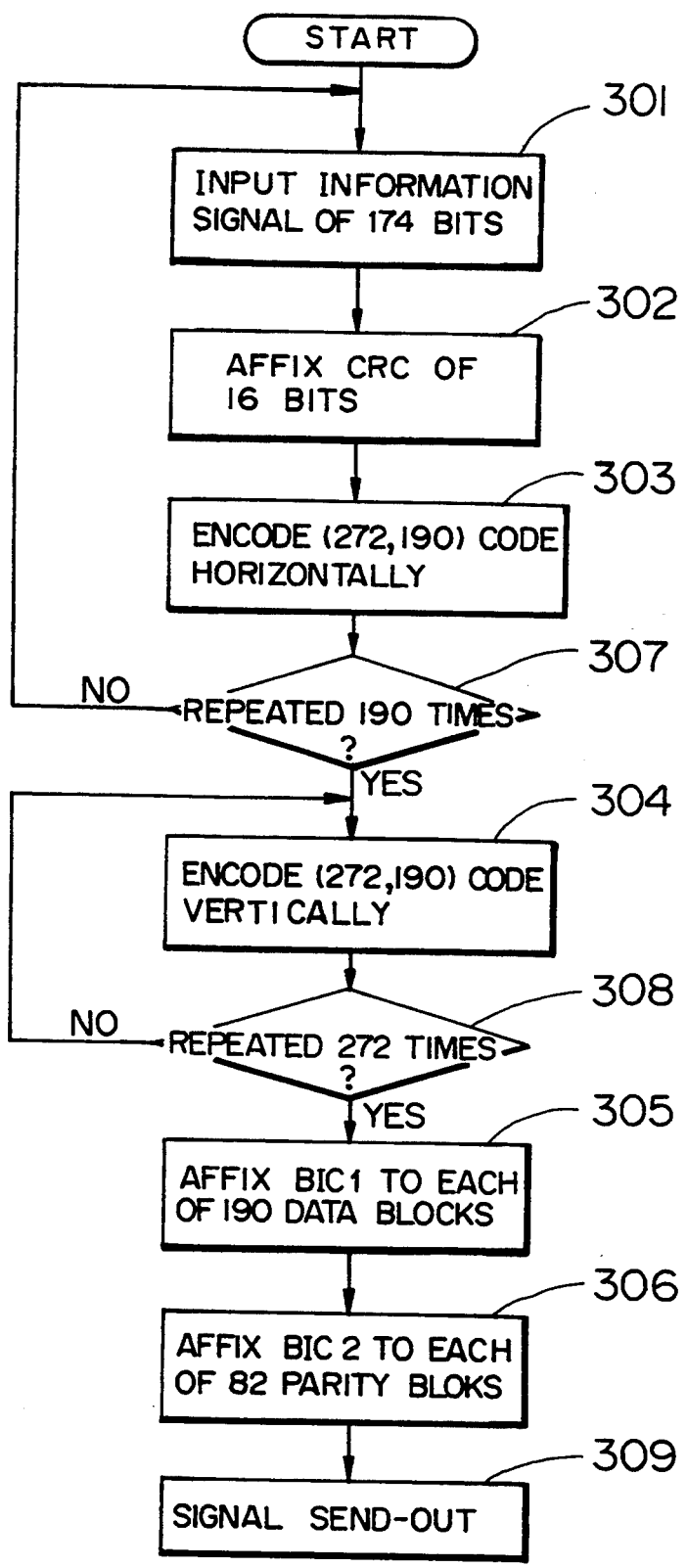
FIG. 3 is a flow chart for illustrating operation of the transmitter apparatus shown in FIG. 1.

Next, referring to FIG. 3, description will be directed to the operation of the transmitter apparatus shown in FIG. 1 for implementing the frame structure shown in FIG. 2.

Initially, in a step 301, the information signal to be sent out is inputted to the CRC adding or affixing circuit 400 sequentially by a predetermined number of bits. In a step 302, a CRC code 206 is affixed to the information signal or data part of 174 bits by the CRC affixing circuit 400, wherein the CRC code 206 is composed of 16 bits. Subsequently, in a step 303, the (272, 190) code is encoded by the encoder 405 in order to affix the first part of the first parity code 203 to the data in the horizontal direction, which is then followed by repetitive execution of the steps 301, 302 and 303 in a number of times of "190" to thereby complete the encoding in the horizontal or rowwise direction. Upon completion of the encoding in the horizontal direction, i.e., when it is decided in a step 307 that the above-mentioned encoding has been repeated 190 times, then the coding in the vertical or columnwise direction is performed by the encoder 405 in a step 304, which is repeated 272 times become the number of bits in the horizontal or columnwise direction is "272". Upon completion of the encoding in the vertical direction, i.e., when it is decided in a step 308 that the vertical coding has been repeated 272 times, frame codes BIC1 and BIC2 differing each other are affixed to the data block 221 and the parity block 222, respectively, by the block synchronizing code affixing circuit 402 in steps 305 and 306, respectively. The data block 221 and the parity block 222 affixed with the respective frame codes BIC1 and BIC2 are then transferred to the output buffer 403 in a step 309, whereon the data are successively sent out to the digital modulator 408 in the sequence shown in FIG. 2.

Figure 4:
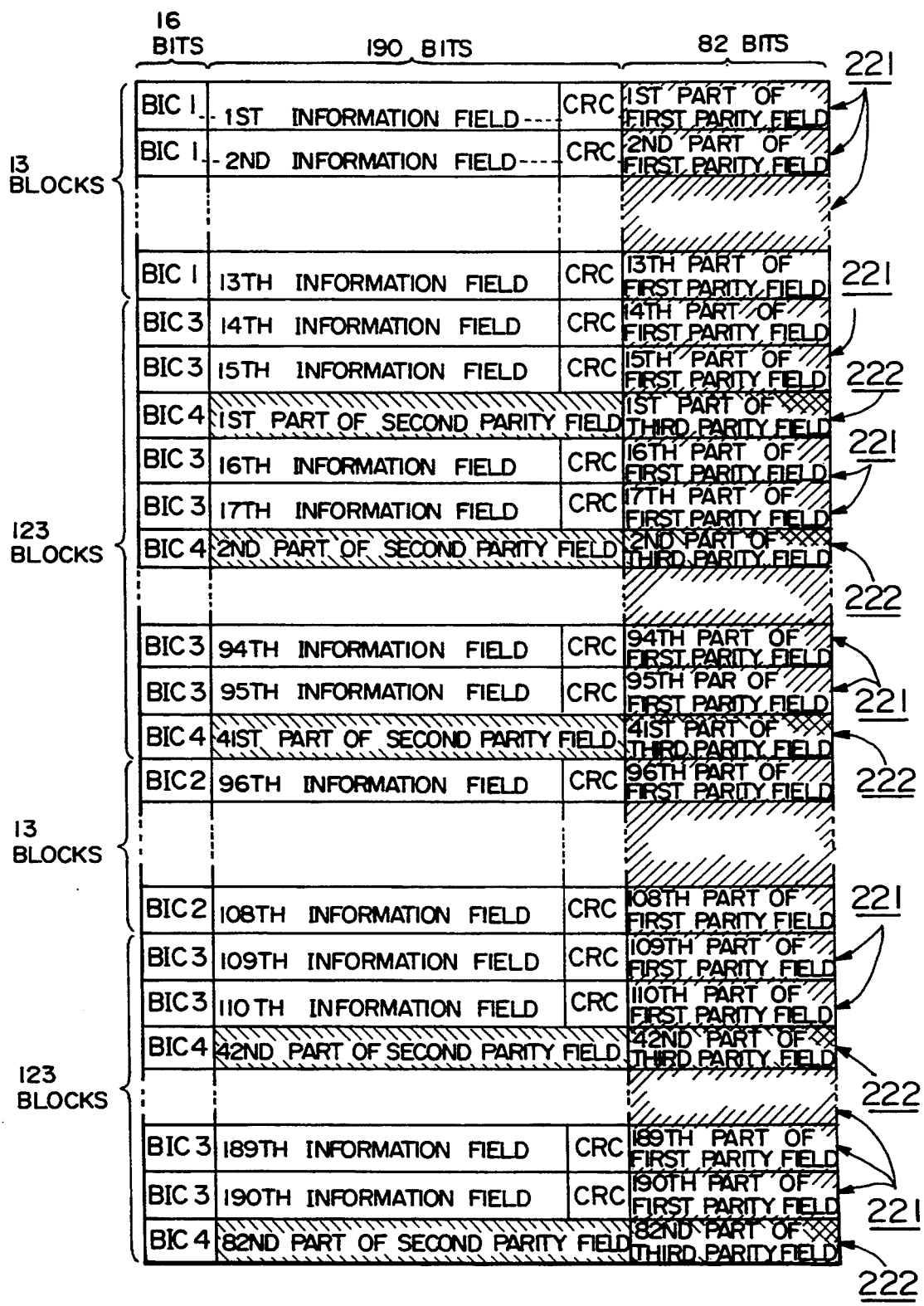
FIG. 4 is a conceptual view for illustrating another example of the frame structure which can also be employed in carrying out the invention.

FIG. 4 shows another example of the frame structure which can also be employed in carrying out the present invention.

The frame structure shown in FIG. 4 differs from the one shown in FIG. 2 in that the blocks are so rearranged that the blocks are sent out dispersedly for the purpose of preventing the 82 parity blocks 222 from being sent out in concentration. By virtue of the frame structure shown in FIG. 4, there can positively be excluded such unwanted situation in which the instantaneous sending-out of the data is inhibited, because the information required on a real time basis such as the information to be sent out upon power-on (turning-on of power supply) can fall within the duration of the parity block 222. In the frame structure shown in FIG. 2, two different types of block synchronizing codes are employed. In contrast, in the case of the frame structure shown in FIG. 4, there are used four different types of block synchronizing codes. This is for the purpose of increasing the number of points of change within the frame. It should be understood that two types of the block synchronizing codes can of course be used in the case of the frame structure shown in FIG. 4. Parenthetically, the sending sequences is same as the frame shown in FIG. 2.

Figure 5:
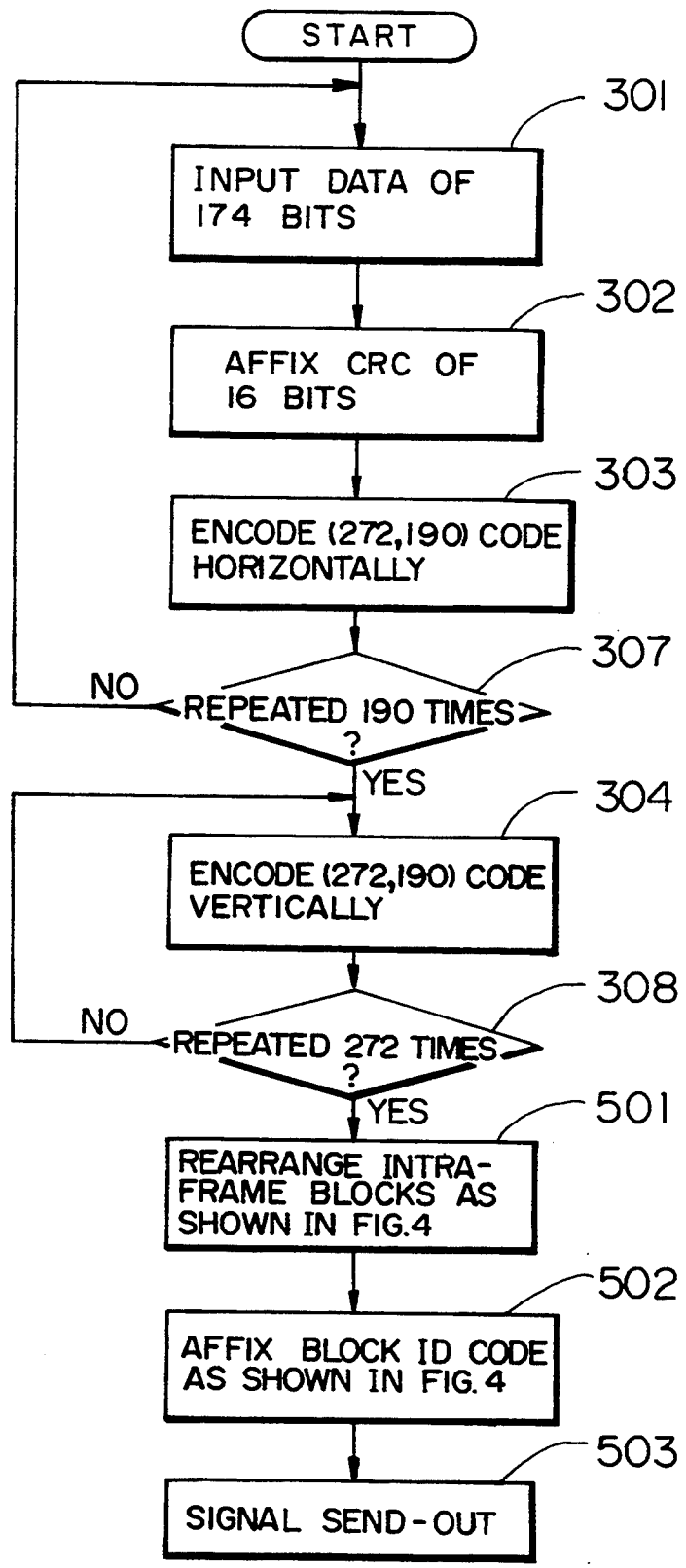
FIG. 5 is a flow chart for illustrating another example of operation of the transmitter apparatus.

FIG. 5 shows a procedure for structurizing the frame shown in FIG. 4 by using the apparatus shown in FIG. 1. Referring to FIG. 5, the steps 301 to 304 and 308 are same as those denoted by like reference numerals in FIG. 3. Accordingly, repeated description of these steps will be unnecessary. In a step 501, the blocks within the frame are rearrayed in the manner as illustrated in FIG. 4 by the block synchronizing code affixing circuit 404. In a step 502, corresponding identification codes are affixed to the respective blocks by the synchronizing code affixing circuit 404, which is then followed by a steps 503 where the blocks are transferred to the output buffer 406 to be sent out in the sequence shown in FIG. 4 (i.e., in the same sequence as the frame shown in FIG. 2). The block rearrangement mentioned above can be realized by modifying correspondingly and appropriately the operation of the read/write address generation circuit 407.

As will be appreciated from the above description, a powerful error correction can be realized by virtue of use of the product error correcting code according to the teaching of the invention incarnated in the illustrated embodiment. Besides, instantaneous decoding is now possible because it is sufficient to decode the error correcting code in one direction. Thus, the problem of time lag ascribable to the interleave can successfully be solved.

Figure 6:
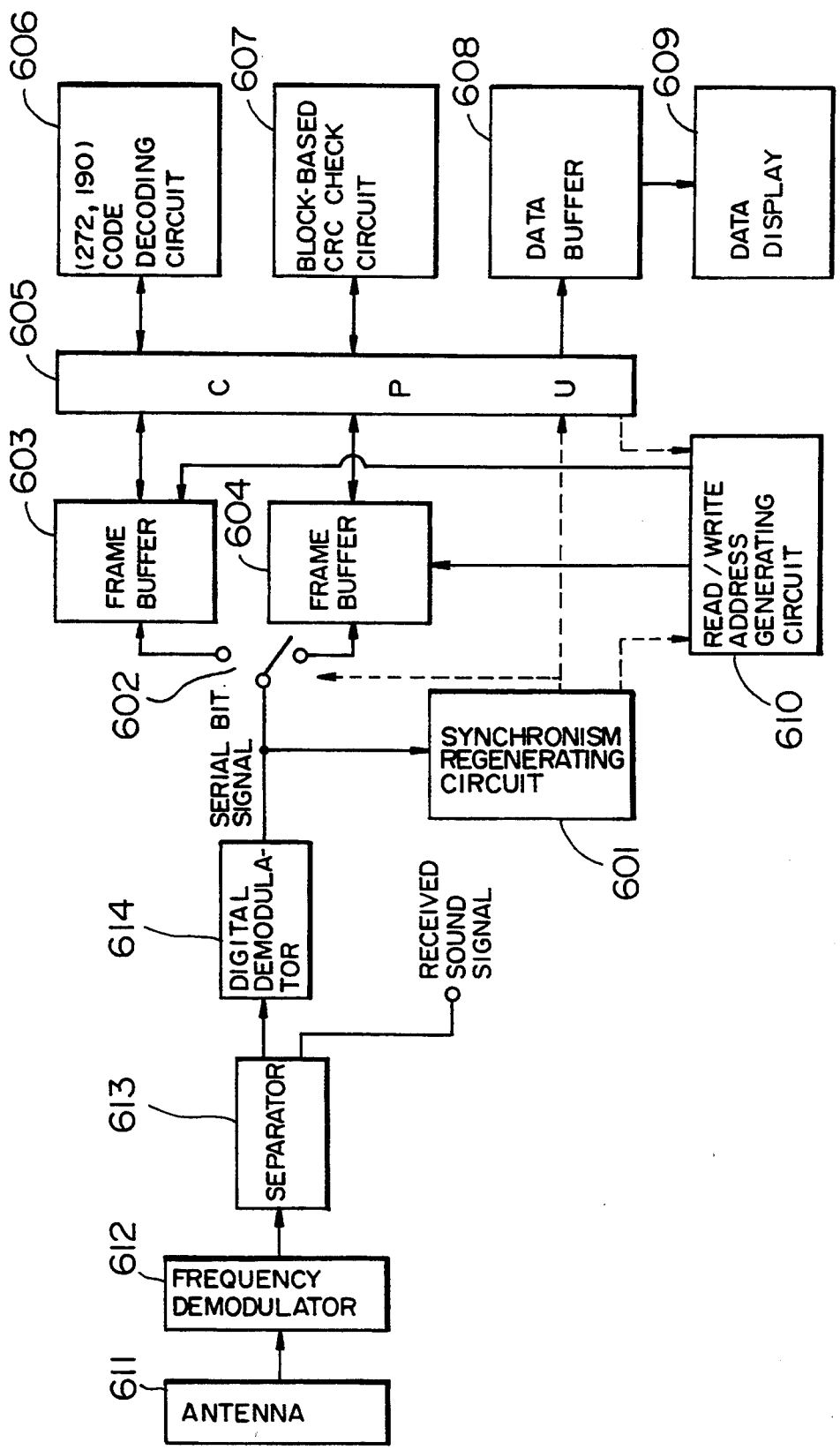
FIG. 6 is a functional block diagram showing an arrangement of a receiver apparatus according to another embodiment of the invention.

FIG. 6 shows a receiver apparatus according to another embodiment of the invention. This receiver apparatus is designed to receive the FM multiplexed signal sent out from the transmitter apparatus shown in FIG. 1. In the following description, it is assumed that the frame structure illustrated in FIG. 2 is adopted.

The receiver apparatus shown in FIG. 6 includes an antenna 611, a frequency demodulator 612 and a digital demodulator 614. The FM multiplexed signal sent out from the transmitter apparatus shown in FIG. 1 is caught by the antenna 611 and demodulated by the frequency demodulator 612. The demodulated signal is then separated from a received sound signal corresponding to the sound signal mentioned hereinbefore by a separator 613. The separated signal is then demodulated by the digital demodulator 614, resulting in restoration of a serial bit signal which corresponds to the output signal of the output buffer 406 shown in FIG. 1. Further, the receiver apparatus shown in FIG. 6 includes a synchronism regenerating circuit 601 for reestablishing a block synchronism and a frame synchronism for the received signal (serial bit signal) through the processing illustrated in FIG. 7, a change-over switch 602, frame buffers 603 and 604 for storing alternately the received signals changed over in accordance with the regenerated frame synchronizing signal, a read/write address generating circuit 610 for supplying a read address signal and a write address signal to the frame buffers 603 and 604, a CPU (Central Processing Unit) 605 for controlling and managing coordinately the reception processings through the procedure illustrated in FIGS. 8 and 9, a decoding circuit 606 for decoding the (272, 190) product code as provided for the purpose of performing error correction on the frame basis in the horizontal and vertical directions, a CRC code check circuit 607 for checking the CRC code affixed on a block-by-block basis, a data buffer 608 for storing the data to be displayed, and a data display unit 609 for displaying the data stored in the data buffer 608. In the case of the instant embodiment, the information signal mentioned previously represents the data of which contents are to be displayed on the data display unit 609.

Now, description will be made of operation of the receiver apparatus shown in FIG. 6.

Figure 7:
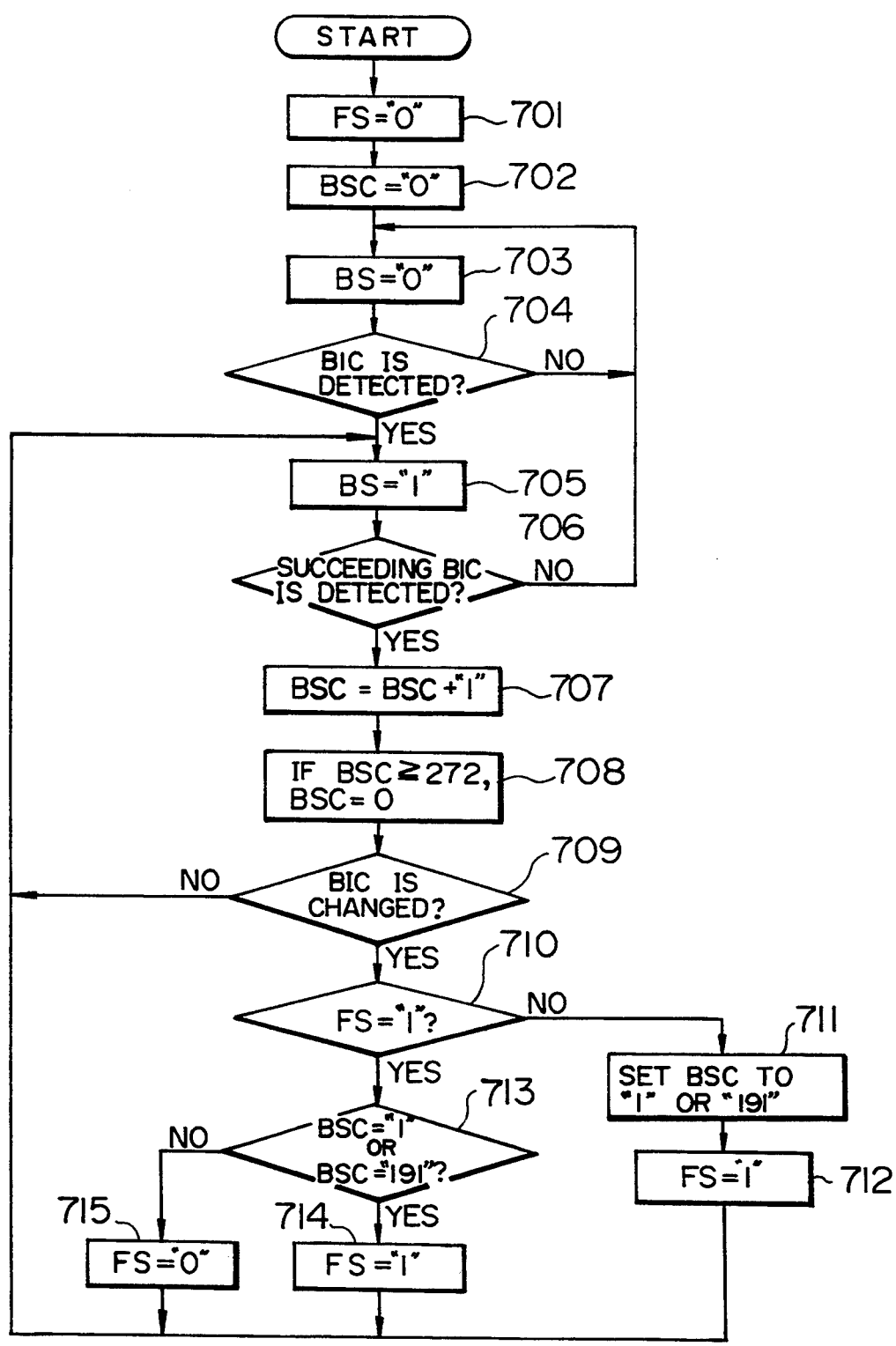
FIGS. 7 to 9 are flow charts for illustrating, by way of example, operation of the receiver apparatus shown in FIG. 6.

In the place, operation of the synchronism regenerating circuit 601 will be elucidated by reference to FIG. 7.

In a step 701, a frame synchronism flag FS is set to "0". The frame synchronism flag FS is secured in a predetermined area of an internal memory incorporated in the synchronism regenerating circuit 601. The flag state in which FS="0" indicates that the frame synchronism is not established, while the flag FS set to "1" indicates that the frame synchronism is established. Next in a step 702, a counter BSC secured in another predetermined area of the internal memory of the synchronism regenerating circuit 601 is set to "0". This counter BSC serves for indicating intra-frame positions of the received blocks corresponding, respectively, to the data block 221 and the parity block 222 mentioned previously. Subsequently, in a step 703, a block synchronism flag BS is set to "0". This block synchronism flag BS is secured in a further predetermined area of the internal memory incorporated in the synchronism regenerating circuit 601. The flag state represented by BS="0" indicates that the block synchronism is not established, while the flag set to "1" indicates the state in which the block synchronism is established. In a succeeding step 704, decision is made as to whether any one of the block synchronizing code BIC1 or BIC2 is detected from the serial bit signal. If the answer of this decision step 704 is negative (No), the step 703 is resumed, whereon execution of the steps 703 and 704 is repeated until either the block synchronizing code BIC1 or BIC2 is detected. Upon detection of either one of the code BIC1 or BIC2, the block synchronism flag BS is set to "1" in a step 705. Subsequently, in a step 706, decision is made as to detection of the succeeding code BIC1 or BIC2 with a delay corresponding to one block in succession to the detection of the preceding code BIC1 or BIC2. Unless the succeeding code is detected yet, the step 703 is resumed, and if otherwise the processing proceeds to a step 707 where the value of the counter BSC is incremented by "1". Next, in a step 708, it is decided whether the value of the counter BSC is equal to or greater than "272". If the answer of this decision step is affirmative (Yes), the value of the counter BSC is set to "0". In a step 709, decision is made as to whether the block synchronizing code BIC1 or BIC2 detected currently has changed from the code detected one block before (i.e., if BIC1→BIC2 or BIC2-→BIC1). In case the result of this decision is negative (i.e., when BIC1→BIC1 or BIC2→BIC2), the step 705 is resumed. If otherwise, the processing proceeds to a step 710 where it is decided whether the frame synchronism flag FS is "1"or not. Unless the frame synchronism flag FS is "1", the processing proceeds to a step 711 and otherwise to a step 713. In the step 711, the counter BSC is set to "1" when the change of the block synchronizing code as decided in the step 709 is from BIC2 to BIC1, while the value of the counter BSCA is set to "191" when the above-mentioned change of the block synchronizing code is from BIC1 to BIC2. Next, in a step 712, the frame synchronizing flag FS is set to "1", and then the step 705 is resumed. On the other hand, in the step 713, it is decided whether the value of the counter BSC is "1" when the change of the block synchronizing code as decided in the step 709 is from BIC2 to BIC1, while decision is made as to whether the value of the counter BSC is "191" when the change in the block synchronizing code as decided in the step 709 is from BIC1 to BIC2. In case the above decision results in that the value of the counter BSC is "1" or "191", the frame synchronism flag FS is set to "1" in a step 714, whereon the step 705 is resumed. When the value of the counter BSC neither "1" nor "191", the frame synchronism flag FS is set to "0" in a step 715, whereupon return is made to the step 705.

Through the processing described above, the synchronism regenerating circuit 601 of the receiver apparatus according to the instant embodiment regenerates or establishes the block synchronism as well as the frame synchronism. The synchronism regenerating circuit 601 supplies the corresponding signals to the read/write address generating circuit 610 on the basis of the result of the processing described above, as a result of which there are stored in the aforementioned frame buffers 603 and 604 on the frame-by-frame basis the received data 209, the first received parity codes 203, the second received parity codes 204 and the third received parity codes 205 which correspond, respectively, to the data 209, the first parity codes 203, the second parity codes 204 and the third parity codes 205 mentioned previously by reference to FIG. 2 in the form of serial bit signal. For convenience of the description, the data field sent out and the data field as received are denoted by the same reference numeral 209. Similarly, the signals sent out and those received are denoted by like reference numerals. It should here be mentioned that the values of the frame synchronism flag FS, the counter BSC and the block synchronism flag BS are fetched by the CPU 605 as described later on.

As is apparent from the above, no protection is assured for the block synchronism and the frame synchronism in the case of the instant embodiment. It should however be understood that the protection may be made for the block synchronism as well as the frame synchronism. Further, although it has been assumed in the above description that no frame synchronizing signal is received, it will readily be appreciated that means for receiving and detecting the frame synchronizing signal can also be provided for establishing the state of the frame synchronism.

Figure 8:
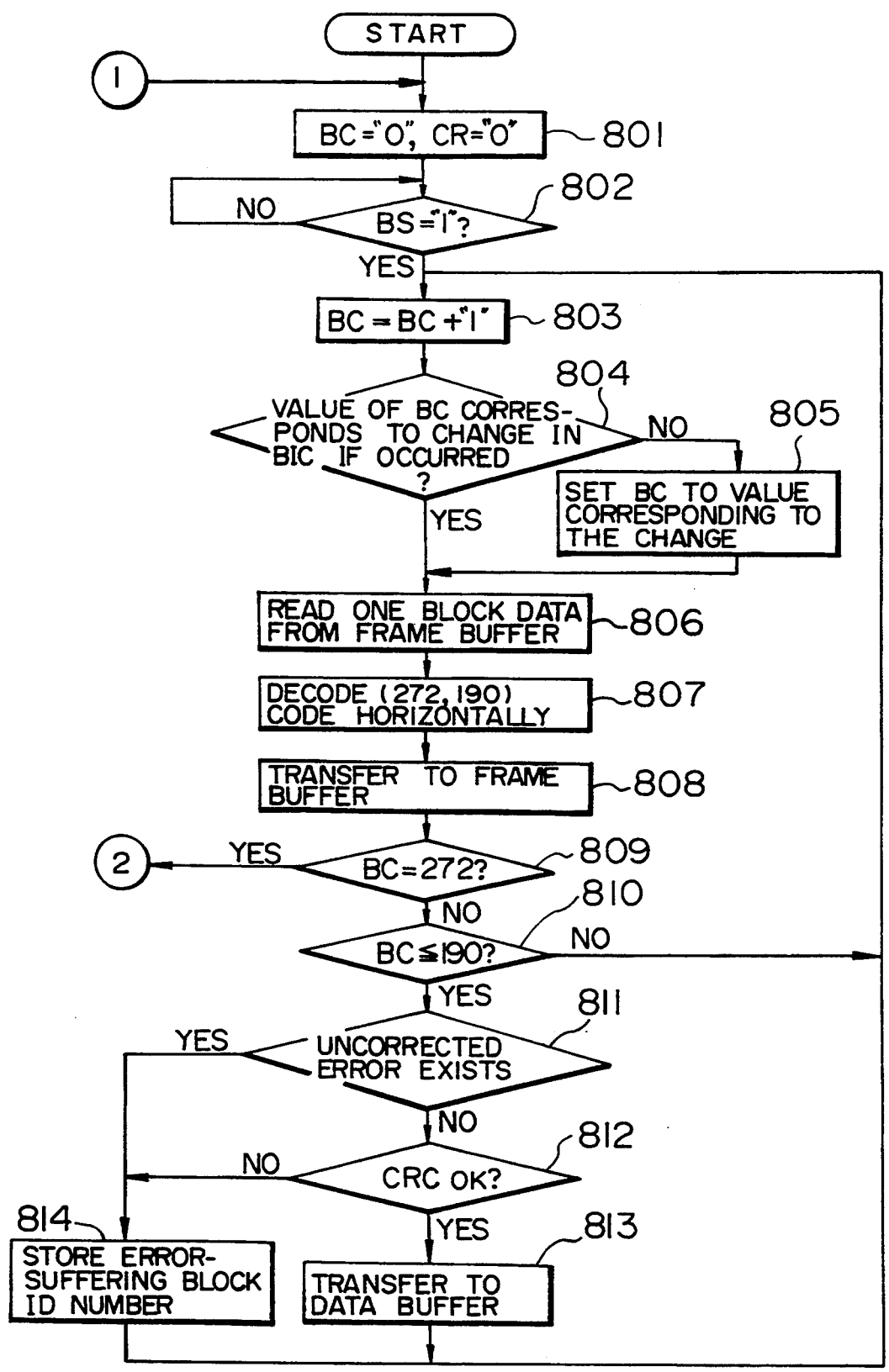
Figure 9:
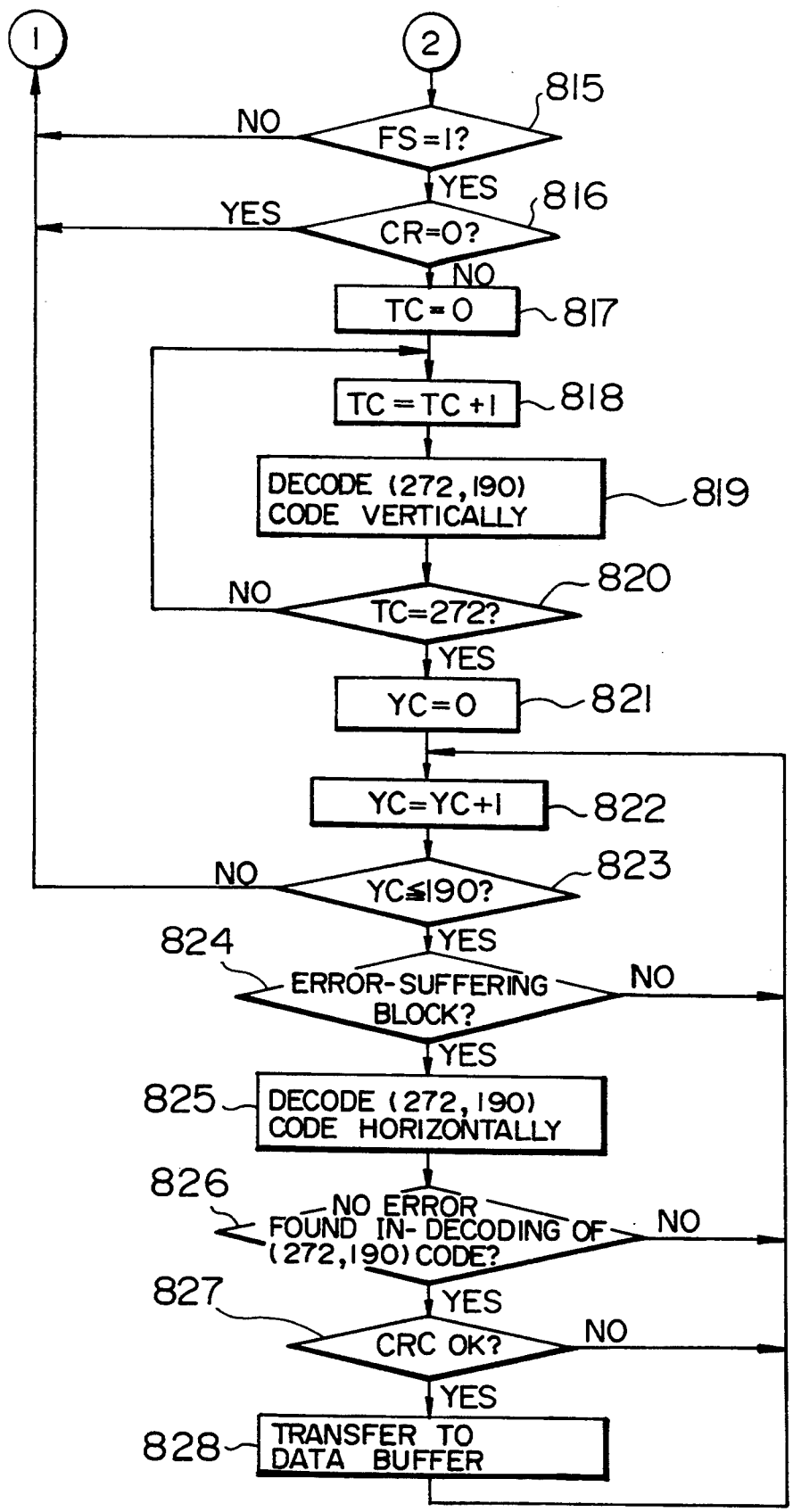

Next, description will be made of the operation of the CPU 605 by reference to FIGS. 8 and 9.

Initially in a step 801, a block counter BC and a correction flag CR secured in the respective predetermined areas of the internal memory incorporated in the CPU 605 are set to "0", respectively. Subsequently, in a step 802, it is decided whether the aforementioned block synchronism flag BS is "1" or not (i.e., whether the block synchronism state has been established or not). Unless the block synchronism flag B is "1" (i.e., unless the block synchronism state prevails), establishment of the block synchronism is waited for. Upon establishment of the block synchronism state (i.e., upon detection of BS="1"), the block counter BC is incremented by one. Next, in a step 804, when it is decided that the block synchronizing code BIC1 or BIC2 detected currently changes from the block synchronizing code BIC1 or BIC2 detected precedingly, then decision is made as to whether the block counter BC has a value corresponding to that change. If so, the processing proceeds to a step 806, while otherwise the value of the block counter BC is so set as to correspond to the change of BIC in the step 805, whereupon the processing proceeds to a step 806 where the data of one block except for the block synchronizing code BIC1 or BIC2, i.e., received data block 221 or received parity block 222 except for the block synchronizing code BIC1 or BIC2 is loaded in the CPU 5. In a next step 807, the horizontally encoded (272, 190) code is decoded for the block as loaded. More specifically, in the step 807, the received data 209 or the first received parity 203 fetched in the step 806 or alternatively the second received parity 204 or the third received parity 205 fetched in the step 806 is decoded. In a succeeding step 808, the signal resulting from the decoding step 807 is transferred to the original address of the original frame buffer 603 or 604. Next, in a step 809, it is decided whether the value of the block counter BC is "272". If so, this indicates that decoding of the signal corresponding to one frame in the horizontal or rowwise direction has been completed. Accordingly, the processing proceeds to a step 817. Unless the value of the block counter BC is "272", indicating that the decoding of that one frame signal in the horizontal direction is not completed yet, the processing proceeds to a step 810. In the step 810, decision is made as to whether or not the value of the block counter BC is smaller than "190" inclusive. When the answer of this decision step 810 is negative (NO), indicating that the signal just undergone the decoding in the horizontal direction corresponds to the received parity block 222, return is made to the step 803. On the other hand, when the decision step 810 results in an affirmative answer, indicating that the signal resulting from the current decoding in the horizontal direction corresponds to the received data block 221, the processing proceeds to a step 811. At this juncture, it should be mentioned that although the decision as to the correspondence of the signal obtained from the current decoding to the received parity block 222 or the received data block 221 is effected by deciding whether the value of the block counter BC is smaller than "190" inclusive in the case of the instant embodiment, such correspondence can be identified by deciding whether the block synchronizing signal is BIC1 or BIC2. In the step 811, decision is made as to whether there remains error uncorrected in the received data 209 or the first parity 203 derived from the current horizontal decoding. Unless the uncorrected error is detected, the processing proceeds to a step 812 and otherwise to a step 814. In the step 812, decision is again made on the basis of the received CRC code 206 as to whether uncorrected error exists in the received data 209 and the first parity 203 or the received data 219 resulting from the current horizontal decoding. In other words, decision is made in the step 812 as to the presence of undetected or overlooked error, so to say.

This step 812 is however spared in case no CRC code 206 is contained in the transmitted signal. When no overlooked error is detected, the processing proceeds to a step 813 and otherwise to a step 814. In the step 813, the received information 208 contained in the received data field 209 resulting from the current horizontal decoding is transferred to the data buffer 608 and identified as the received signal. The received information 208 transferred to the data buffer 608 is displayed on the data display unit 609. Upon completion of the processing step 813, the step 803 is regained. On the other hand, in the step 814, the current value of the block counter BC, i.e. the identification number of the block suffering from error is stored in the internal memory of the CPU 605 with the correction flag CR being set to "1". Thereafter, the step 803 is resumed.

In a step 815, it is decided whether the aforementioned frame synchronism flag FS is "1". Unless the frame synchronism flag FS is "1" (indicating that the frame synchronism state is not yet established), this means that decoding in the vertical or columnwise direction is impossible. In that case, return is made to the step 801. On the contrary, when the frame synchronism flag is "1" (representing the frame synchronism state), the processing proceeds to a step 816 where it is decided whether the correction flag CR is "0" or not. When the correction flag CR is "0", indicating that no error is found in the received data 209 and the first parities 203 received or alternatively in the received data fields 209 corresponding to all the received data blocks 221 of one frame, the step 801 is resumed. On the other hand, unless the correction flag CR is "0", indicating the presence of error in the received data 209 and the received first parities 203 or alternatively in the received data 209 corresponding to the received data blocks 221 of one frame, the processing proceeds to a step 817, in which the counter TC secured in a predetermined area of the internal memory incorporated in the CPU 605 is reset to "0". Subsequently, in a step 818, the counter TC is incremented by one. In a succeeding step 819, 272 bit signals located at same bit position (at a same column in the frame structure shown in FIG. 2) of the respective blocks which correspond to the value of the counter TC are read out from the buffer memory 603 or 604. (In this conjunction, it is to be noted that the value "1" of the counter TC indicates the start bits of the respective received data 208 with TC="272" indicating the last bits in the respective first received parities 203 and the third received parities 205.) The 272 bit signals as read out are decoded, i.e., the vertical (272, 190) code is decoded for the 272 bit signal as read out, whereon the bit signals as decoded are transferred to the original addresses of the original frame buffer 603 or 604. In this manner, in the step 819, there are decoded the bit signals located at the same bit positions in the received data signals 209 decoded in the step 807 for each frame as well as the bit signals located at the same bit positions in the second received parity signals 204 decoded in the step 807 for each frame. To say in another way, in the step 819, there are decoded the bit signals located at the same bit positions in the first received parity signals 203 decoded in the step 807 for each frame as well as the bit signals located at same bit positions in the third received parity signals 205 decoded in the step 807 for each frame. Upon completion of the processing in the step 819, it is decided in the step 820 whether the value of the counter TC is "272" or not. When the answer of this decision step is negative, (i.e., when the coding in the vertical direction is not yet completed), the step 818 is resumed. On the other hand, when the decision step results in affirmative answer (indicating completion of decoding in the vertical or columnwise direction), the processing proceeds to a step 821 where the value of the counter YC is reset to "0", which is then followed by a step 822 where the counter YC is incremented by one. The counter value YC equal to one indicates the first data block 221, while the counter value YC="190" indicates the 190-th data block 221. Further, the counter value YC="191" indicates the first parity block 222 while the counter value YC="272" indicates the 82-nd parity block 222. Subsequently, in a step 823, decision is made as to whether or not the counter value YC is smaller than "190" inclusive. Unless it is smaller than "190" inclusive (indicating completion of the second decoding of the received data block in the horizontal direction), the step 801 is regained, while otherwise (i.e., unless the second decoding of the received data block 221 is completed), the processing proceeds to a step 824 where the value of the counter YC and the error block identification number stored in the step 814 are collated with each other to thereby decide whether or not any uncorrected error exists in the received data block 221 corresponding to the counter value YC. In the case of the received data block 221 containing no error, the step 822 is resumed, while the processing proceeds to a step 825 when the received data block suffers from error. In the step 825, the received data block 221 corresponding to the counter value YC except for the block synchronizing code BIC1 is fetched by the CPU 605, whereon the horizontal (272, 190) code is decoded for the received block 221 fetched this time. In other words, the received data 209 and the first received parity 203 fetched this time are decoded. Subsequently, in a step 826, decision is made as to whether uncorrected error exists in the received data 209 and the first parity 203 undergone the decoding in the horizontal direction this time. When it is decided that no error exists, the processing proceeds to a step 827 and otherwise the step 822 is resumed. In the step 827, decision is again made as to whether any uncorrected error is present in the received data 209 and the first parity 203 or the received data 209 decoded in the horizontal direction this time. In other words, in the step 827, it is decided whether the so-called undetected or overlooked error exits. This step 827 is not carried out in case no CRC received code 206 is contained in the signal sent out. Unless the undetected error is found, the processing proceeds to a step 828 while otherwise the step 822 is regained. In the step 828, the received information 208 of the received data 209 undergone the decoding in the horizontal direction this time is transferred to the data buffer 607 to be identified as the received signal.

As will now be understood from the above description, according to the instant embodiment of the present invention, the data can be displayed with an extremely short time delay when it is decided that no error is detected as the result of the error correction and the CRC check in the horizontal direction, because the data is then transferred immediately or straight-forwardly to the data buffer 608. On the other hand, in the case where the correction can not be completed solely with the correction in the horizontal or rowwise direction because of lots of errors, decoding is again performed in the horizontal direction after having carried out the error correction in the vertical or columnwise direction, whereby the reception of information signal can be effectuated with an extremely high accuracy.

Figure 10:
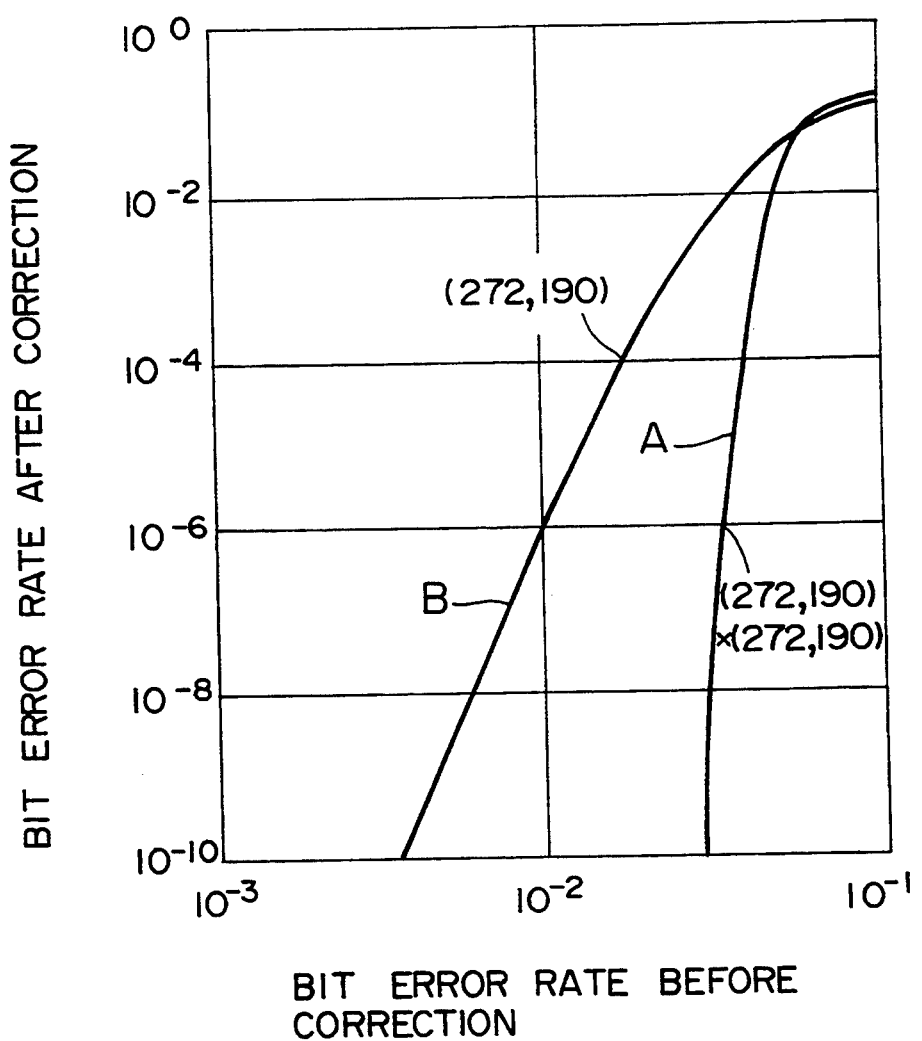
FIG. 10 is a view showing graphically a bit error rate after an error correction effected according to the teachings of the invention.
Figure 11:
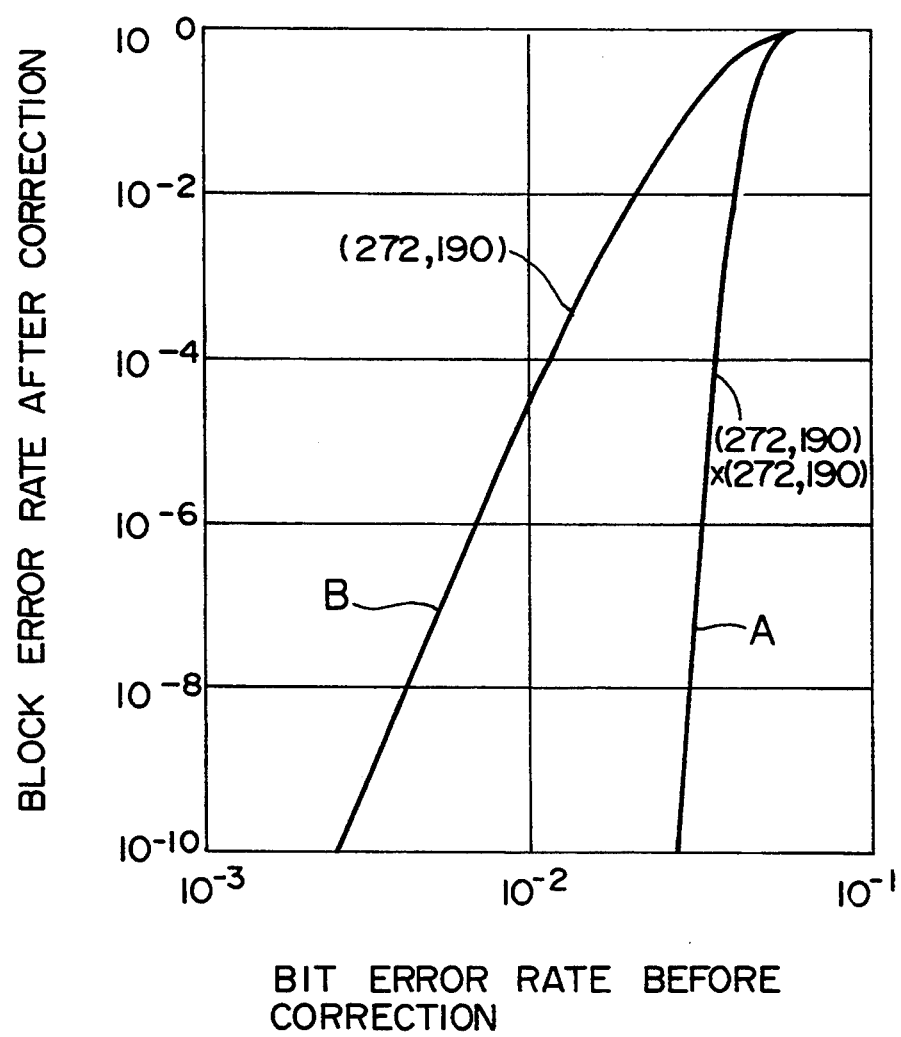
FIG. 11 is a view showing graphically a block error rate after the error correction effected according to the invention.
Figure 12:
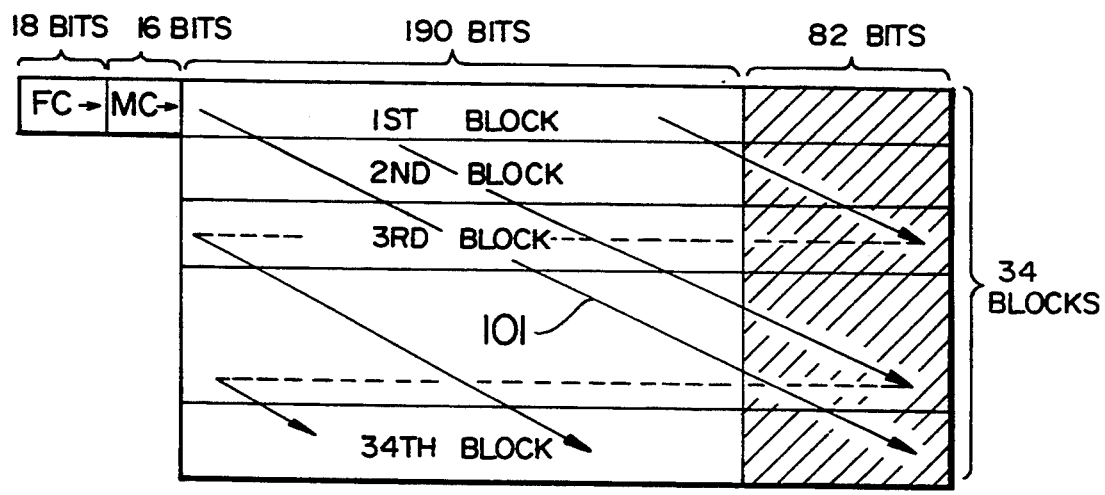
FIG. 12 is a view showing an example of the frame structure employed in the transmission/reception of information signal heretofore.

FIGS. 10 and 11 are characteristic diagrams for graphically illustrating the effects achieved with the instant embodiment of the invention. As can be understood by comparing the vertical and horizontal decoding (represented by curves A in FIG. 10 and 11, respectively) with the horizontal decoding (represented by curves B in FIGS. 10 and 11, respectively), the correction capabilities given in terms of bit error rate and block error rate, respectively, can be enhanced much more by the horizontal and vertical decodings by using the (272, 190) product code when compared with the horizontal decoding with the (272, 190) code. Parenthetically, in both of FIGS. 10 and 11, bit error rate before the error correction is taken along the abscissa, while the bit error rate after the error correction is taken along the ordinate in FIG. 10 with the block error rate after the error correction being taken along the ordinate in FIG. 11 on the assumption that block error does exist so far as even one bit error is present in the portion containing the information and the first parity.

In the foregoing description, it has been assumed that the receiver apparatus according to the illustrated embodiment of the present invention is applied to the frame structure shown in FIG. 2. It should however be appreciated that the receiver apparatus according to the invention can equally be applied to such a frame structure as shown in FIG. 4.

In the case of the frame structure shown in FIG. 4, there are used four different types of block synchronizing codes. They are BIC1, BIC2, BIC3 and BIC4, of which BIC4 represents a parity block. In conjunction with this frame structure, it is however noted that four check points have to be secured within one frame for checking the block counter for the frame synchronism because four different types of block synchronizing codes are employed and that the block corresponding to the block identification number has to be placed in the frame buffer 603 or 604 upon transfer to the frame buffer described hereinbefore in conjunction with the step 806 shown in FIG. 8 because the blocks are interleaved upon being sent out.

In the above, the present invention has been described on the assumption that the (272, 190) product code is employed. However, the invention is never limited to the use of the this product code but utterly different codes ma be used in both the horizontal (rowwise) and the vertical (columnwise) directions, respectively.

As can be understood from the foregoing description, the FM multiplexed signal can be received rapidly and accurately even in the case of the FM multiplex broadcast for the mobile receiver stations.

We claim:

1. A method of transmitting an information signal, comprising the steps of:
    generating a plurality of data block signals on the basis of said information signal;
    generating a plurality of parity block signals on the basis of said plural data block signals;
    generating a frame signal including said plural data block signals and said parity block signals; and
    sending out said frame signal;
    wherein each of said data block signals includes a first block synchronizing signal indicating the start of the associated data block signal, a data signal containing said information signal and a first parity signal obtained by coding said data signal;

wherein each of said parity block signals includes a second block synchronizing signal indicating the start of the associated parity block signal, a second parity signal and a third parity signal;

wherein bit signals located at same bit positions in said second parity signals, respectively, are obtained by encoding bit signals located at same bit positions in said data signals, respectively;

wherein bit signals located at same bit positions in said third parity signals, respectively, are obtained by encoding bit signals located at same bit positions in said first parity signals, respectively, or wherein said third parity signal in each of said parity block signals is obtained by encoding said second parity signal in each of said parity block signals; and wherein said first block synchronizing signals differ from said second block synchronizing signals.

2. An information signal transmitting method according to claim 1, wherein each of said data signals contains a CRC code signal obtained by encoding said information signal contained in each of said data signals.

3. An information signal transmitting method according to claim 1, wherein each of said data signals and each of said second parity signal are composed of 190 bit signals, respectively, while each of said first parity signals and each of said third parity signals are composed of 82 bit signals, respectively.

4. An information signal transmitting method according to claim 1, wherein said parity block signals are dispersed substantially uniformly in said frame signal.

5. An information signal transmitting method according to claim 1, wherein said frame signal send-out step includes a step of providing a sound signal, a step of multiplexing said sound signal and said frame signal, and a step of frequency-modulating the multiplexed signal and sending out it as a frequency-modulated multiplexed signal.

6. An apparatus for transmitting an information signal, comprising:

means for generating a plurality of data block signals on the basis of said information signal;

means for generating a plurality of parity block signals on the basis of said plural data block signals;

means for generating a frame signal including said plural data block signals and said parity block signals; and means for sending out said frame signal;

wherein each of said data block signals includes a first block synchronizing signal indicating the start of the associated data block signal, a data signal containing said information signal and a first parity signal obtained by encoding said data signal;

wherein each of said parity block signals includes a second block synchronizing signal indicating the start of the associated parity block signal, a second parity signal and a third parity signal;

wherein bit signals located at same bit positions in said second parity signals, respectively, are obtained by encoding bit signals located at same bit positions in said data signals, respectively;

wherein bit signals located at same bit positions in said third parity signals, respectively, are obtained by encoding bit signals located at same bit positions in said first parity signals, respectively, or wherein said third parity signal in each of said parity block signals is obtained by encoding said second parity signal in each of said parity block signals; and wherein said first block synchronizing signals differ from said second block synchronizing signals.

7. An information signal transmitting apparatus according to claim 6, wherein each of said data signals contains a CRC code signal obtained by encoding said information signal contained in each of said data signals.

8. An information signal transmitting apparatus according to claim 6, wherein each of said data signals and each of said second parity signal is composed of 190 bit signals, respectively, while each of said first parity signals and each of said third parity signals is composed of 82 bit signals, respectively.

9. An information signal transmitting apparatus according to claim 6, wherein said parity block signals are dispersed substantially uniformly in said frame signal.

10. An information signal transmitting apparatus according to claim 6, wherein said frame signal send-out means includes means for providing a sound signal, means for multiplexing said sound signal and said frame signal, and means for frequency-modulating the multiplexed signal and sending out it as a frequency-modulated multiplexed signal.

11. A method of receiving an information signal, comprising the steps of:

receiving a sent signal as a received frame signal;

wherein said frame signal includes a plurality of data block signals and a plurality of parity block signals;

each of said data block signals including a first block synchronizing signal indicating the start of the associated data block signal, a data signal containing said information signal and a first parity signal obtained by encoding said data signal;

each of said parity block signals including a second block synchronizing signal indicating the start of the associated parity block signal, a second parity signal and a third parity signal;

bit signals located at same bit positions in said second parity signals, respectively, being obtained by encoding bit signals located at same bit positions in said data signals, respectively;

bit signals located at same bit positions in said third parity signals, respectively, being obtained by encoding bit signals located at same bit positions in said first parity signals, respectively, or alternatively said third parity signal in each of said parity block signals being obtained by encoding said second parity signal in each of said parity block signals;

detecting at least one of said first block synchronizing signals and said second block synchronizing signals from said received frame signal, said first block synchronizing signals being different from said second block synchronizing signals;

establishing block synchronization for each of said data block signals and parity block signals based on the detected first or second block synchronizing signals and establishing frame synchronization by detecting a point of change in the detected block synchronizing signal from one of said first and second block synchronizing signals to the other;

storing in storage means received data signals and first received parity signals corresponding, respectively, to said data signals and said first parity signals contained in the associated data block signals, respectively, as well as second received parity signals and third received parity signals corresponding, respectively, to said second parity signals and said third parity signals contained in the associated parity block signals, respectively, on the basis of said received frame signal in response to the detection of said at least one block synchronizing signal; and decoding received information signal corresponding to said information signal on the basis of the signals stored in said storage means and identifying the received signal on the basis of said decoded received information signal.

12. An information signal receiving method according to claim 11, wherein each of said data signals contains a CRC code signal obtained by encoding said information signal contained in each of said data signals.

13. An information signal receiving method according to claim 11, wherein each of said data signals and each of said second parity signals are composed of 190 bit signals, respectively, while each of said first parity signals and each of said third parity signals are composed of 82 bit signals, respectively.

14. An information signal receiving method according to claim 11, wherein said parity block signals are dispersed substantially uniformly in said frame signal.

15. An information signal receiving method according to claim 11, wherein said step of receiving a sent frame signal as a received frame signal includes a step of receiving a frequency-modulated multiplexed signal containing said frame signal, and a step of frequency-demodulating the frequency-modulated multiplexed signal as received and a step of separating said frame signal from said frequency-demodulated signal.

16. An information signal receiving method according to claim 11, wherein said decoding and identifying step includes:

a step of decoding said received data signal and said first received parity signal corresponding to each of said data block signals through a first error correction processing;

a step of decoding said received parity signal and said third received parity signal corresponding to each of said parity block signals through a second error correction processing;

a first decision step of making decision as to whether any error not corrected exists in the received data signal or the first received parity signal which corresponds to each of said data block signals and which has been decoded through said first error correction processing; and a step of identifying as a reception signal the received information signal which corresponds to said information signal and which are contained in each of the received data signals decoded through said first error correcting processing and decided not containing any error uncorrected.

17. An information signal receiving method according to claim 16, wherein each of said data signals includes a CRC code signal obtained by encoding said information signal contained in the associated data signal, further comprising a decision step for making decision as to whether or not uncorrected error exists in the received data signal or in the first received parity signal which corresponds to each of said data block signals and which results from the encoding through said first error correcting processing on the basis of a received CRC code signal which corresponds to said CRC code signal and which is contained in the received data signal in correspondence to each of said data block signals, decoded through said first error correcting processing.

18. An information signal receiving method according to claim 16, wherein each of said data signals and each of said second parity signal are composed of 190 bit signals, respectively, while each of said first parity signals and each of said third parity signals are composed of 82 bit signals, respectively.

19. An information signal receiving method according to claim 16, wherein said parity block signals are dispersed substantially uniformly in said frame signal.

20. An information signal receiving method according to claim 16, wherein said step of receiving a sent frame signal as a received frame signal includes a step of receiving said frequency-modulated multiplex signal containing said frame signal, a step of frequency-demodulating the received frequency-modulated multiplexed signal, and a step of separating said frame signal from said frequency-demodulated signal.

21. A method of receiving an information signal, comprising the steps of:

receiving a sent signal as a received frame signal;

wherein said frame signal includes a plurality of data block signals and a plurality of parity block signals;

each of said data block signals including a first block synchronizing signal indicating the start of the associated data block signal, a data signal containing said information signal and a first parity signal obtained by encoding said data signal;

each of said parity block signals including a second block synchronizing signal indicating the start of the associated parity block signal, a second parity signal and a third parity signal;

bit signals located at same bit positions in said second parity signals, respectively, being obtained by encoding bit signals located at same bit positions in said data signals, respectively;

bit signals located at same bit positions in said third parity signals, respectively, being obtained by encoding bit signals located at same bit positions in said first parity signals, respectively, or alternatively said third parity signal in each of said parity block signals being obtained by encoding said second parity signal in each of said parity block signals;

detecting at least one of said first block synchronizing signals and said second block synchronizing signals from said received frame signal;

storing in storage means received data signals and first received parity signals corresponding, respectively, to said data signals and said first parity signals contained in the associated data block signals, respectively, as well as second received parity signals and third received parity signals corresponding, respectively, to said second parity signals and said third parity signals contained in the associated parity block signals, respectively, on the basis of said received frame signal in response to the detection of said at least one block synchronizing signal; and decoding received information signal corresponding to said information signal on the basis of the signals stored in said storage means and identifying the received signal on the basis of said decoded received information signal;

wherein said decoding and identifying step comprises the steps of:
  decoding said received data signal and said first received parity signal corresponding to each of said data block signals through a first error correction processing;
  decoding said received parity signal and said third received parity signal corresponding to each of said parity block signals through a second error correction processing,
  making a first decision as to whether any error not corrected exists in the received data signal or the first received parity signal which corresponds to each of said data block signals and which has been decoded through said first error correction processing, and
  identifying as a reception signal the received information signal which corresponds to said information signal and which are contained in each of the received data signals decoded through said first error correcting processing and decided not containing any error uncorrected;
wherein said decoding and identifying step further comprises the steps of:
  decoding through a third error correcting processing the bit signals located at same positions in the received data signals decoded through the respective first error correction processings and corresponding to said frame signal and the bit signals located at same bit positions in the second received parity signals decoded through the respective second error correction processings and corresponding to said frame signal, when a decision is made that error remains uncorrected in any one of the received data signals or the first received parity signals which correspond to the data block signals contained in said frame signal and which have been decoded through said first error correcting processing,
  decoding through a fourth error correcting processing the bit signals located at same positions in the first received parity signals decoded through the respective first error correction processings and corresponding to said frame signal and the bit signals located at same bit positions in the third received parity signals decoded through the respective second error correcting processings and corresponding to said frame signal, when a decision is made that error remains uncorrected in any one of the received data signals or the first received parity signals which correspond to the data block signals contained in said frame signal and which have been decoded through the first error correcting processing,
  decoding through a fifth error correcting processing the signal of the received data signals decoded through said third error correcting processing and the first received parity signals decoded through said fourth error correcting processing and corresponding to the respective data block signals contained in said frame signal, wherein said signal undergoing said fifth error correcting processing corresponds to the received data and the first received parity signal decoded through said first error correcting processing and decided that uncorrected error exists,
  making a second decision as to whether or not error remains uncorrected in the received data signal which has been decoded through said fifth error correcting processing and which corresponds to each of said data block signals, and
  identifying as the reception signal the signal which corresponds to said information signal and which is contained in each of the data signals decoded through said fifth error correcting processing and decided as containing no uncorrected error.

22. An information signal receiving method according to claim 21,
  each of said data signals containing a CRC code signal obtained by encoding said information signal contained in said data signal,
  wherein said first decision step includes a step of making decision as whether or not error uncorrected exists in the received data signal or said first received parity signal decoded through said first error correcting processing on the basis of the received CRC code signal contained in the received data signal decoded through said first error correcting processing and corresponding to each of said data block signals; and
  wherein said second decision step includes a step of making decision as to whether or not uncorrected error exists in the received data signal corresponding to each of said data block signals and decoded through said fifth error correcting processing on the basis of said received CRC code signal corresponding to said CRC code signal contained in the received data signal corresponding to each of said data block signal and decoded through said fifth error correcting processing.

23. An information signal receiving method according to claim 21, wherein said first block synchronizing signals differ from said second block synchronizing signals.

24. An information signal receiving method according to claim 21, wherein said frame signal further includes a frame synchronizing signal indicating the start of said frame signal.

25. An information signal receiving method according to claim 21, wherein each of said data signals and each of said second parity signal are composed of 190 bit signals, respectively, while each of said first parity signals and each of said third parity signals are composed of 82 bit signals, respectively.

26. An information signal receiving method according to claim 21, wherein said parity block signals are dispersed substantially uniformly in said frame signal.

27. An information signal receiving method according to claim 21, wherein said step of receiving a sent frame signal as a received frame signal includes a step of receiving said frequency-modulated multiplexed signal containing said frame signal, a step of frequency-demodulating the received frequency-modulated multiplexed signal, and a step of separating said frame signal from said frequency-demodulated signal.

28. An apparatus for receiving an information signal, comprising:
  means for receiving a sent signal as a received frame signal;
  wherein said frame signal includes a plurality of data block signals and a plurality of parity block signals;
  each of said data block signals including a first block synchronizing signal indicating the start of the associated data block signal, a data signal containing said information signal and a first parity signal obtained by encoding said data signal;

each of said parity block signals including a second block synchronizing signal indicating the start of the associated parity block signal, a second parity signal and a third parity signal;

bit signals located at same bit positions in said second parity signals, respectively, being obtained by encoding bit signals located at same bit positions in said data signals, respectively;

bit signals located at same bit positions in said third parity signals, respectively, being obtained by encoding bit signals located at same bit positions in said first parity signals, respectively, or alternatively said third parity signal in each of said parity block signals being obtained by encoding said second parity signal in each of said parity block signals;

means for detecting at least one of said first block synchronizing signals and said second block synchronizing signals from said received frame signal;

means for storing in storage means received data signals and first received parity signals corresponding, respectively, to said data signals and said first parity signals contained in the associated data block signals, respectively, as well as second received parity signals and third received parity signals corresponding, respectively, to said second parity signals and said third parity signals contained in the associated parity block signals, respectively, on the basis of said received frame signal in response to the detection of said at least one block synchronizing signal; and decoding and identifying means for decoding received information signal corresponding to said information signal on the basis of the signals stored in said storage means and identifying the received signal on the basis of said decoded received information signal;

wherein said first block synchronizing signals differ from said second block synchronizing signals.

29. An information signal receiving apparatus according to claim 28, wherein each of said data signals contains a CRC code signal obtained by encoding said information signal.

30. An information signal receiving apparatus according to claim 28, wherein said first block synchronizing signals differ from said second block synchronizing signals.

31. An information signal receiving apparatus according to claim 28, wherein said frame signal further includes a frame synchronizing signal indicating the start of said frame signal.

32. An information signal receiving apparatus according to claim 28, wherein each of said data signals and each of said second parity signals are composed of 190 bit signals, respectively, while each of said first parity signals and each of said third parity signals are composed of 82 bit signals, respectively.

33. An information signal receiving apparatus according to claim 28, wherein said parity block signals are dispersed substantially uniformly in said frame signal.

34. An information signal receiving apparatus according to claim 28, wherein said means for receiving a sent frame signal as a received frame signal includes means for receiving a frequency-modulated multiplexed signal containing said frame signal, and means for frequency-demodulating the frequency-modulated multiplexed signal as received and means for separating said frame signal from said frequency-demodulated signal.

35. An information signal receiving apparatus according to claim 28, wherein said decoding and identifying means includes:

means for decoding said received data signal and said first received parity signal corresponding to each of said data block signals through a first error correcting processing;

means for decoding said received parity signal and said third received parity signal corresponding to each of said parity block signals through a second error correcting processing;

first decision means for making decision as to whether any error not corrected exists in the received data signal or the first received parity signal which corresponds to each of said data block signals and which has been decoded through said first error correcting processing; and means for identifying as a reception signal the received information signal which corresponds to said information signal and which are contained in each of the received data signals decoded through said first error correcting processing and decided not containing any error uncorrected.

36. An information signal receiving apparatus according to claim 35, wherein each of said data signals includes a CRC code signal obtained by encoding said information signal contained in the associated data signal, said first deciding means including decision means for making decision as to whether or not uncorrected error exists in the received data signal or in the first received parity signal which corresponds to each of said data block signals and which results from the encoding through said first error correcting processing on the basis of a received CRC code signal which corresponds to said CRC code signal and which is contained in the received data signal in correspondence to each of said data block signals decoded through said first error correcting processing.

37. An information signal receiving apparatus according to claim 35, wherein each of said data signals and each of said second parity signal are composed of 190 bit signals, respectively, while each of said first parity signals and each of said third parity signals are composed of 82 bit signals, respectively.

38. An information signal receiving apparatus according to claim 35, wherein said parity block signals are dispersed substantially uniformly in said frame signal.

39. An information signal receiving apparatus according to claim 35, wherein said means for receiving a sent frame signal as a received frame signal includes means for receiving said frequency-modulated multiplex signal containing said frame signal, means for frequency-demodulating the received frequency-modulated multiplexed signal, and means for separating said frame signal from said frequency-demodulated signal.

40. An apparatus for receiving an information signal, comprising:

means for receiving a sent signal as a received frame signal;

wherein said frame signal includes a plurality of data block signals and a plurality of parity block signals;

each of said data block signals including a first block synchronizing signal indicating the start of the associated data block signal, a data signal containing said information signal and a first parity signal obtained by encoding said data signal;

each of said parity block signals including a second block synchronizing signal indicating the start of the associated parity block signal, a second parity signal and a third parity signal;

bit signals located at same bit positions in said second parity signals, respectively, being obtained by encoding bit signals located at same bit positions in said data signals, respectively;

bit signals located at same bit positions in said third parity signals, respectively, being obtained by encoding bit signals located at same bit positions in said first parity signals, respectively, or alternatively said third parity signal in each of said parity block signals being obtained by encoding said second parity signal in each of said parity block signals;

means for detecting at least one of said first block synchronizing signals and said second block synchronizing signals from said received frame signal;

means for storing in storage means received data signals and first received parity signals corresponding, respectively, to said data signals and said first parity signals contained in the associated data block signals, respectively, as well as second received parity signals and third received parity signals corresponding, respectively, to said second parity signals and said third parity signals contained in the associated parity block signals, respectively, on the basis of said received frame signal in response to the detection of said at least one block synchronizing signal; and decoding and identifying means for decoding received information signal corresponding to said information signal on the basis of the signals stored in said storage means and identifying the received signal on the basis of said decoded received information signal;

wherein said decoding and identifying means comprises:

means for decoding said received data signal and said first received parity signal corresponding to each of said data block signals through a first error correcting processing, means for decoding said received parity signal and said third received parity signal corresponding to each of said parity block signals through a second error correcting processing, first decision means for making a decision as to whether any error not corrected exists in the received data signal or the first received parity signal which corresponds to each of said data block signals and which has been decoded through said first error correcting processing, and means for identifying as a reception signal the received information signal which corresponds to said information signal and which are contained in each of the received data signals decoded through said first error correcting processing and decided not containing any error uncorrected;

wherein said decoding and identifying means further comprises:

means for decoding through a third error correcting processing the bit signals located at same positions in the received data signals decoded through the respective first error correction processings and corresponding to said frame signal and the bit signals located at same bit positions in the second received parity signals decoded through the respective second error correction processings and corresponding to said frame signal, when a decision is made that error remains uncorrected in any one of the received data signals or the first received parity signals which correspond to the data block signals contained in said frame signal and which have been decoded through said first error correcting processing, means for decoding through a fourth error correcting processing the bit signals located at same positions in the first received parity signals decoded through the respective first error correction processings and corresponding to said frame signal and the bit signals located at same bit positions in the third received parity signals decoded through the respective second error correcting processings and corresponding to said frame signal, when a decision is made that error remains uncorrected in any one of the received data signals or the first received parity signals which correspond to the data block signals contained in said frame signal and which have been decoded through the first error correcting processing, means for decoding through a fifth error correcting processing the signal of the received data signals decoded through said third error correcting processing and the first received parity signals decoded through said fourth error correcting processing and corresponding to the respective data block signals contained in said frame signal, wherein said signal undergoing said fifth error correcting processing corresponds to the received data and the first received parity signal decoded through said first error correcting processing and decided that uncorrected error exists, second decision means for making a decision as to whether or not error remains uncorrected in the received data signal which has been decoded through said fifth error correcting processing and which corresponds to each of said data block signals, and means for identifying as the reception signal the signal which corresponds to said information signal and which is contained in each of the data signals decoded through said fifth error correcting processing and decided as containing no uncorrected error.

41. An information signal receiving apparatus according to claim 40, each of said data signals containing a CRC code signal obtained by encoding said information signal contained in said data signal, wherein said first decision means includes means for making decision as whether or not error uncorrected exists in the received data signal or said first received parity signal decoded through said first error correcting processing on the basis of the received CRC code signal contained in the received data signal decoded through said first error correcting processing and corresponding to each of said data block signals; and wherein said second decision means includes means for making decision as to whether or not uncorrected error exists in the received data signal corresponding to each of said data block signals and decoded through said fifth error correcting processing on the basis of said received CRC code signal corresponding to said CRC code signal contained in the received data signal corresponding to each of said data block signals and decoded through said fifth error correcting processing.

42. An information signal receiving apparatus according to claim 40, wherein said first block synchronizing signals differ from said second block synchronizing signals.

43. An information signal receiving apparatus according to claim 40, wherein said frame signal further includes a frame synchronizing signal indicating the start of said frame signal.

44. An information signal receiving apparatus according to claim 40, wherein each of said data signals and each of said second parity signal are composed of 190 bit signals, respectively, while each of said first parity signals and each of said third parity signals are composed of 82 bit signals, respectively.

45. An information signal receiving apparatus according to claim 21, wherein said parity block signals are dispersed substantially uniformly in said frame signal.

46. An information signal receiving apparatus according to claim 40, wherein said means for receiving a sent frame signal as a received frame signal includes means for receiving said frequency-modulated multiplex signal containing said frame signal, means for frequency-demodulating the received frequency-modulated multiplexed signal, and means for separating said frame signal from said frequency-demodulated signal.

* * * * *